(12) United States Patent
Takeuchi et al.

(10) Patent No.: US 12,615,447 B2
(45) Date of Patent: Apr. 28, 2026

(54) IMAGING ELEMENT AND IMAGING DEVICE

(71) Applicant: SONY SEMICONDUCTOR SOLUTIONS CORPORATION, Kanagawa (JP)

(72) Inventors: Mitsuhiro Takeuchi, Nagasaki (JP); Sachio Nishi, Nagasaki (JP); Tetsuya Minakawa, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/846,379

(22) PCT Filed: Feb. 17, 2023

(86) PCT No.: PCT/JP2023/005628
§ 371 (c)(1),
(2) Date: Sep. 12, 2024

(87) PCT Pub. No.: WO2023/181735
PCT Pub. Date: Sep. 28, 2023

(65) Prior Publication Data
US 2025/0203228 A1      Jun. 19, 2025

(30) Foreign Application Priority Data
Mar. 25, 2022      (JP) ................................. 2022-050590

(51) Int. Cl.
*H04N 25/13*          (2023.01)
*H10F 39/00*          (2025.01)

(52) U.S. Cl.
CPC ....... *H04N 25/134* (2023.01); *H10F 39/8023* (2025.01); *H10F 39/8053* (2025.01); *H10F 39/8057* (2025.01); *H10F 39/8063* (2025.01)

(58) Field of Classification Search
CPC ...... H04N 25/134; H04N 23/55; H04N 25/13; H10F 39/8023; H10F 39/8053; H10F 39/8057; H10F 39/8063
See application file for complete search history.

(56) References Cited

U.S. PATENT DOCUMENTS

2009/0121371 A1*   5/2009   Kawasaki ............. H10F 39/024
                                                                  264/2.7
2009/0244347 A1*  10/2009   Vaillant ................. H10F 39/024
                                                                  438/69
(Continued)

FOREIGN PATENT DOCUMENTS

JP          2006-269735          10/2006
JP          2008-071972          3/2008
(Continued)

OTHER PUBLICATIONS

English Translation of International Search Report prepared by the Japan Patent Office on Apr. 20, 2023, for International Application No. PCT/JP2023/005628, 5 pgs.

*Primary Examiner* — Mekonnen D Dagnew
(74) *Attorney, Agent, or Firm* — SHERIDAN ROSS P.C.

(57) ABSTRACT

A variation in sensitivity of pixels is reduced. A pixel array unit includes a Bayer array, a red pixel group with red pixel blocks in two rows and two columns, a green pixel group with green pixel blocks in two rows and two columns, and a blue pixel group with blue pixel blocks in two rows and two columns. Each pixel group includes pixel blocks arranged in two rows and two columns with the pixels including a color filter transmitting light of the color of the respective pixel group, and with an on-chip lens common to the pixel group. Each pixel group performs photoelectric conversion of incident light transmitted through the respective color filters and generates an image signal corresponding to the respective pixel group color. The on-chip lens has (Continued)

a different shape for each of the red pixel group, the green pixel group, and the blue pixel group.

21 Claims, 22 Drawing Sheets

(56) References Cited

U.S. PATENT DOCUMENTS

| | | | | |
|---|---|---|---|---|
| 2009/0261440 | A1* | 10/2009 | Kawasaki | H10F 39/024 |
| | | | | 257/E31.127 |
| 2010/0052085 | A1* | 3/2010 | Park | H10F 39/8063 |
| | | | | 257/E31.127 |
| 2012/0211850 | A1 | 8/2012 | Kuboi | |
| 2015/0236066 | A1 | 8/2015 | Tayanaka | |
| 2017/0366770 | A1* | 12/2017 | Yokogawa | H10F 39/8057 |
| 2020/0013817 | A1 | 1/2020 | Otsuji | |
| 2020/0169704 | A1 | 5/2020 | Fujii | |
| 2021/0144315 | A1 | 5/2021 | Yun et al. | |
| 2022/0038663 | A1 | 2/2022 | Hoshino | |
| 2022/0045113 | A1 | 2/2022 | Tayanaka et al. | |

FOREIGN PATENT DOCUMENTS

| | | |
|---|---|---|
| JP | 2012-174885 | 9/2012 |
| JP | 2015-133469 | 7/2015 |
| JP | 2018-129525 | 8/2018 |
| JP | 2019-097058 | 6/2019 |

* cited by examiner

| Hi | Mid | Mid | Hi |
|----|-----|-----|----|
| Mid | Lo | Lo | Mid |
| Mid | Lo | Lo | Mid |
| Hi | Mid | Mid | Hi |

310

RED PIXEL GROUP
(R)

| Lo | Lo | Lo | Lo |
|----|-----|-----|----|
| Hi | Mid | Mid | Hi |
| Hi | Mid | Mid | Hi |
| Lo | Lo | Lo | Lo |

320

GREEN PIXEL GROUP
(Gr)

| Lo | Hi | Hi | Lo |
|----|-----|-----|----|
| Lo | Mid | Mid | Lo |
| Lo | Mid | Mid | Lo |
| Lo | Hi | Hi | Lo |

330

GREEN PIXEL GROUP
(Gb)

| Hi | Mid | Mid | Hi |
|----|-----|-----|----|
| Mid | Lo | Lo | Mid |
| Mid | Lo | Lo | Mid |
| Hi | Mid | Mid | Hi |

340

BLUE PIXEL GROUP
(B)

IMAGING ELEMENT AND IMAGING DEVICE

CROSS REFERENCE TO RELATED APPLICATIONS

This application is a national stage application under 35 U.S.C. 371 and claims the benefit of PCT Application No. PCT/JP2023/005628, having an international filing date of 17 Feb. 2023, which designated the United States, which PCT application claimed the benefit of Japanese Patent Application No. 2022-050590, filed 25 Mar. 2022, the entire disclosures of each of which are incorporated herein by reference.

FIELD

The present disclosure relates to an imaging element and an imaging device.

BACKGROUND

In an imaging element configured by arranging a plurality of pixels, an imaging element configured by arranging, in a Bayer array, a pixel group in which a plurality of pixels having color filters of the same color are arranged adjacent to each other has been proposed (see, for example, Patent Literature 1).

CITATION LIST

Patent Literature

Patent Literature 1: US 2021/0144315 A

SUMMARY

Technical Problem

However, in the above conventional technique, there is a problem that a sensitivity difference between the pixels included in a unit cannot be adjusted, and an image quality is degraded.

Therefore, the present disclosure proposes an imaging element and an imaging device that reduce a sensitivity difference between pixels in a pixel group in which a plurality of pixels having the same color filter are arranged adjacent to each other.

Solution to Problem

The present disclosure has been conceived to solve the problem described above, and a first aspect thereof is an imaging element includes: a pixel array unit configured by arranging, in a Bayer array, a red pixel group in which red pixel blocks are arranged in two rows and two columns, a green pixel group in which green pixel blocks are arranged in two rows and two columns, and a blue pixel group in which blue pixel blocks are arranged in two rows and two columns, the red pixel blocks being configured by arranging, in two rows and two columns, red pixels that include a color filter transmitting red light, perform photoelectric conversion of incident light transmitted through the color filter, and generate an image signal corresponding to the red light and by arranging a common on-chip lens, the green pixel blocks being configured by arranging, in two rows and two columns, green pixels that include a color filter transmitting green light, perform photoelectric conversion of incident light transmitted through the color filter, and generate an image signal corresponding to the green light and by arranging a common on-chip lens, the blue pixel blocks being configured by arranging, in two rows and two columns, blue pixels that include a color filter transmitting blue light, perform photoelectric conversion of incident light transmitted through the color filter, and generate an image signal corresponding to the blue light and by arranging a common on-chip lens, wherein the common on-chip lens has a different shape for each of the red pixel group, the green pixel group, and the blue pixel group.

Furthermore, a second aspect of the present disclosure is an imaging device includes: a pixel array unit configured by arranging, in a Bayer array, a red pixel group in which red pixel blocks are arranged in two rows and two columns, a green pixel group in which green pixel blocks are arranged in two rows and two columns, and a blue pixel group in which blue pixel blocks are arranged in two rows and two columns, the red pixel blocks being configured by arranging, in two rows and two columns, red pixels that include a color filter transmitting red light, perform photoelectric conversion of incident light transmitted through the color filter, and generate an image signal corresponding to the red light and by arranging a common on-chip lens, the green pixel blocks being configured by arranging, in two rows and two columns, green pixels that include a color filter transmitting green light, perform photoelectric conversion of incident light transmitted through the color filter, and generate an image signal corresponding to the green light and by arranging a common on-chip lens, the blue pixel blocks being configured by arranging, in two rows and two columns, blue pixels that include a color filter transmitting blue light, perform photoelectric conversion of incident light transmitted through the color filter, and generate an image signal corresponding to the blue light and by arranging a common on-chip lens; and a processing circuit that processes the image signal, wherein the common on-chip lens has a different shape for each of the red pixel group, the green pixel group, and the blue pixel group.

Furthermore, a third aspect of the present disclosure is an imaging element includes: a pixel array unit configured by arranging, in a Bayer array, a red pixel group in which red pixel blocks are arranged in two rows and two columns, a green pixel group in which green pixel blocks are arranged in two rows and two columns, and a blue pixel group in which blue pixel blocks are arranged in two rows and two columns, the red pixel blocks being configured by arranging, in two rows and two columns, red pixels that include a color filter transmitting red light, perform photoelectric conversion of incident light transmitted through the color filter, and generate an image signal corresponding to the red light and by arranging a common on-chip lens, the green pixel blocks being configured by arranging, in two rows and two columns, green pixels that include a color filter transmitting green light, perform photoelectric conversion of incident light transmitted through the color filter, and generate an image signal corresponding to the green light and by arranging a common on-chip lens, the blue pixel blocks being configured by arranging, in two rows and two columns, blue pixels that include a color filter transmitting blue light, perform photoelectric conversion of incident light transmitted through the color filter, and generate an image signal corresponding to the blue light and by arranging a common on-chip lens; and a light-shielding wall disposed in a region of the color filter between the red pixel group, the green pixel group, and the blue pixel group, wherein the light-shielding wall has a different shape for each of the red pixel group, the green pixel group, and the blue pixel group.

Furthermore, a fourth aspect of the present disclosure is an imaging device includes: a pixel array unit configured by arranging, in a Bayer array, a red pixel group in which red pixel blocks are arranged in two rows and two columns, a green pixel group in which green pixel blocks are arranged in two rows and two columns, and a blue pixel group in which blue pixel blocks are arranged in two rows and two columns, the red pixel blocks being configured by arranging, in two rows and two columns, red pixels that include a color filter transmitting red light, perform photoelectric conversion of incident light transmitted through the color filter, and generate an image signal corresponding to the red light and by arranging a common on-chip lens, the green pixel blocks being configured by arranging, in two rows and two columns, green pixels that include a color filter transmitting green light, perform photoelectric conversion of incident light transmitted through the color filter, and generate an image signal corresponding to the green light and by arranging a common on-chip lens, the blue pixel blocks being configured by arranging, in two rows and two columns, blue pixels that include a color filter transmitting blue light, perform photoelectric conversion of incident light transmitted through the color filter, and generate an image signal corresponding to the blue light and by arranging a common on-chip lens; a light-shielding wall disposed in a region of the color filter between the red pixel group, the green pixel group, and the blue pixel group; and a processing circuit that processes the image signal, wherein the light-shielding wall has a different shape for each of the red pixel group, the green pixel group, and the blue pixel group.

BRIEF DESCRIPTION OF DRAWINGS

FIG. 12 is a diagram illustrating a configuration example of pixels according to the second embodiment of the present disclosure.

FIG. 13 is a diagram illustrating a configuration example of pixels according to a third embodiment of the present disclosure.

FIG. 14 is a diagram illustrating a configuration example of pixels according to the third embodiment of the present disclosure.

FIG. 16 is a diagram illustrating a configuration example of pixels according to the fourth embodiment of the present disclosure.

FIG. 17 is a diagram illustrating a configuration example of pixels according to the fourth embodiment of the present disclosure.

DESCRIPTION OF EMBODIMENTS

Hereinafter, embodiments of the present disclosure will be described in detail with reference to the drawings. The description will be given in the following order. Note that, in the following embodiments, the same parts are denoted by the same reference signs, and redundant description will be omitted.

1. First Embodiment
2. Second Embodiment
3. Third Embodiment
4. Fourth Embodiment
5. Fifth Embodiment 1. First Embodiment

[Configuration of Imaging Element]

Figure 1:
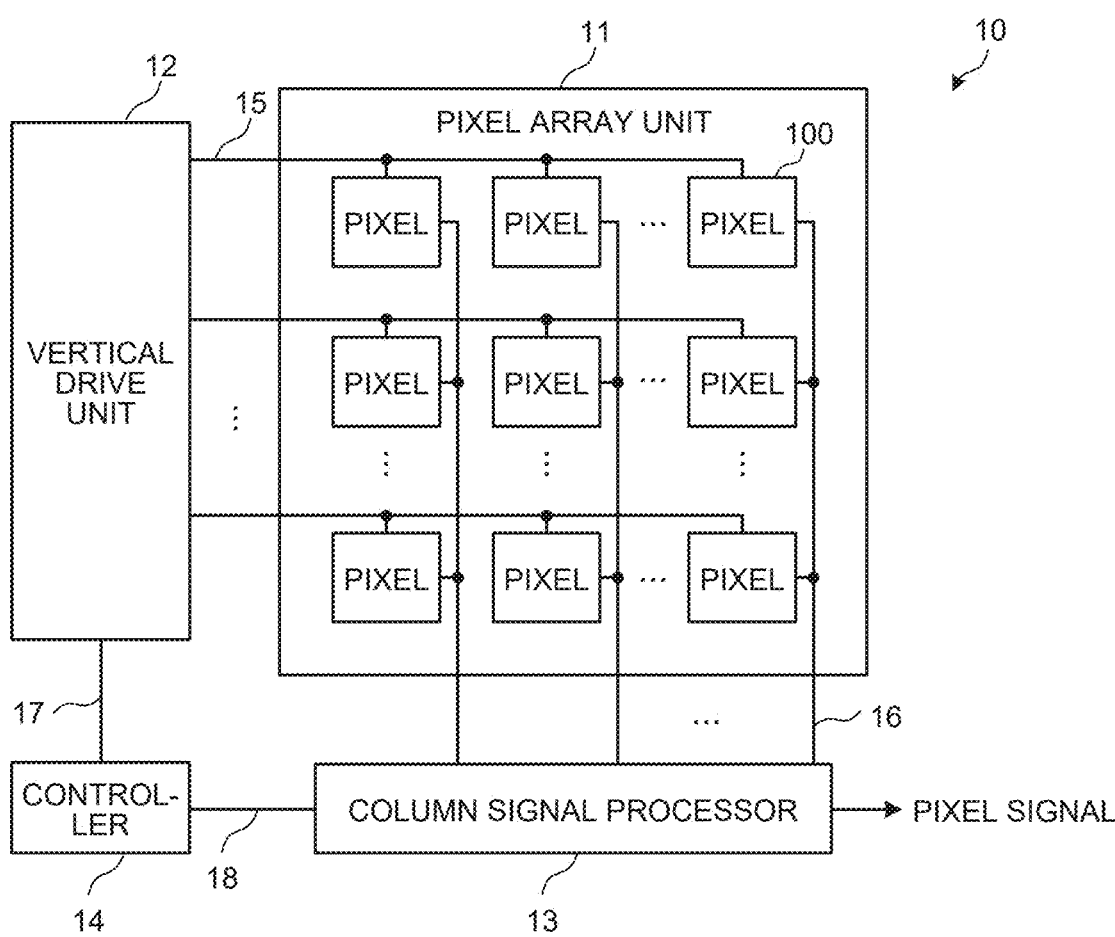
FIG. 1 is a diagram illustrating a configuration example of an imaging element according to an embodiment of the present disclosure.

FIG. 1 is a diagram illustrating a configuration example of an imaging element according to an embodiment of the present disclosure. The drawing is a block diagram illustrating a configuration example of an imaging element 10. The imaging element 10 is a semiconductor element that generates image data of a subject. The imaging element 10 includes a pixel array unit 11, a vertical drive unit 12, a column signal processor 13, and a controller 14.

The pixel array unit 11 is configured by arranging a plurality of pixels 100. The pixel array unit 11 in the drawing represents an example in which the plurality of pixels 100 is arrayed in a shape of a two-dimensional matrix. Here, the pixel 100 includes a photoelectric converter that performs photoelectric conversion of incident light, and generates an image signal of a subject on the basis of emitted incident light. For example, a photodiode can be used as the photoelectric converter. Signal lines 15 and 16 are wired to each pixel 100. The pixel 100 is controlled by a control signal transmitted by the signal line 15 to generate an image signal, and outputs the generated image signal via the signal line 16. Note that the signal line 15 is arranged for each row in the shape of the two-dimensional matrix, and is commonly wired to the plurality of pixels 100 arranged in one row. The signal line 16 is arranged for each column in the shape of the two-dimensional matrix, and is commonly wired to the plurality of pixels 100 arranged in one column.

The vertical drive unit 12 generates a control signal of the pixel 100 described above. The vertical drive unit 12 in the drawing generates a control signal for each row of the two-dimensional matrix of the pixel array unit 11 and sequentially outputs the control signal via the signal line 15.

The column signal processor 13 processes the image signal generated by the pixel 100. The column signal processor 13 in the drawing simultaneously processes the image signals from the plurality of pixels 100 arranged in one row of the pixel array unit 11 transmitted via the signal line 16. As this processing, for example, analog-digital conversion of converting an analog image signal generated by the pixel 100 into a digital image signal and correlated double sampling (CDS) of removing an offset error of the image signal can be performed. The processed image signal is output to a circuit or the like outside the imaging element 10.

The controller 14 controls the vertical drive unit 12 and the column signal processor 13. The controller 14 in the drawing generates a control signal for controlling the vertical drive unit 12 and the column signal processor 13 on the basis of data for instructing a clock, an operation mode, and the like input from an external circuit or the like. Next, the controller 14 outputs control signals via the signal lines 17 and 18, respectively, to control the vertical drive unit 12 and the column signal processor 13. Note that the column signal processor 13 is an example of a processing circuit described in the claims.

[Configuration of Imaging Element in Plane]

Figure 2:
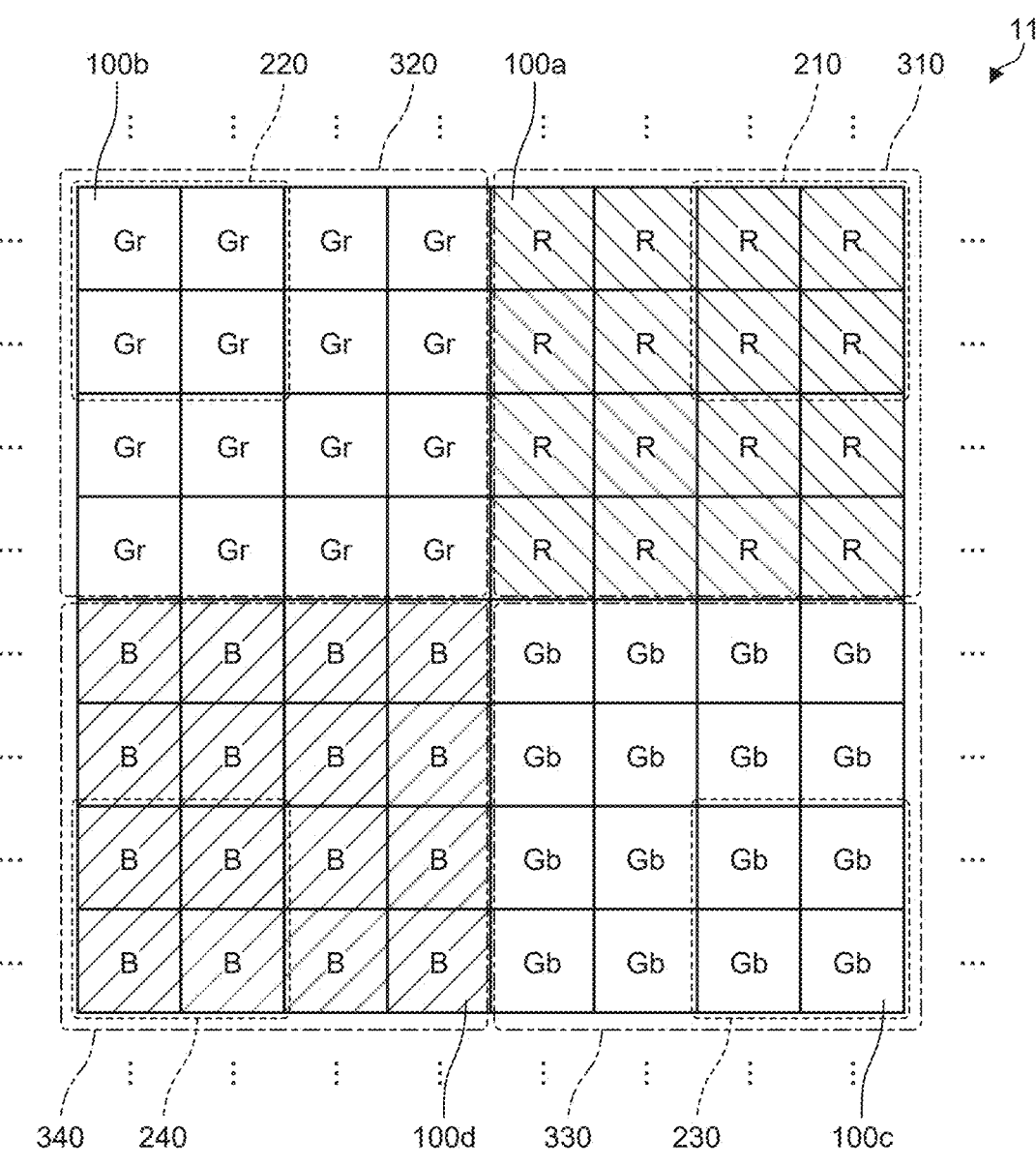
FIG. 2 is a diagram illustrating a configuration example of pixels according to an embodiment of the present disclosure.

FIG. 2 is a diagram illustrating a configuration example of pixels according to an embodiment of the present disclosure. The drawing is a plan view illustrating a configuration example of the pixels 100. As described above, the pixels 100 are arrayed in the pixel array unit 11. The pixel array unit 11 in the drawing represents an example in which the plurality of pixels 100 is arrayed in a two-dimensional matrix. Note that "R", "Gr", "Gb", and "B" attached to the pixels 100 in the drawing represent types of color filters to be described later. "R" in the drawing represents a color filter (color filter 161) corresponding to red light. "Gr" represents a color filter (color filter 162) corresponding to green light. "Gb" represents a color filter (color filter 163) corresponding to green light. "B" represents a color filter (color filter 164) corresponding to blue light.

The outlined rectangles in the drawing represent the color filters 162 and 163 corresponding to green light. A rectangle hatched diagonally in the lower right in the drawing represents the color filter 161 corresponding to red light. A rectangle hatched diagonally in the upper right in the drawing represents the color filter 164 corresponding to blue light.

A rectangle in the drawing represents a region of the pixel 100. A pixel in which the color filter 161 corresponding to red light is disposed is referred to as a red pixel 100a. The pixels in which the color filters 162 and 163 corresponding to the green light are disposed are referred to as a green pixel 100b and a green pixel 100c, respectively. A pixel in which the color filter 164 corresponding to blue light is disposed is referred to as a blue pixel 100d.

A plurality of adjacent pixels is collectively referred to as a pixel block. The color filter of the same color is disposed in the pixels of the pixel block. An on-chip lens to be described later is commonly disposed in the pixel block. The drawing illustrates an example of a pixel block including four pixels 100 arranged in two rows and two columns. A pixel block configured by arranging the red pixels 100a in two rows and two columns is referred to as a red pixel block 210. Pixel blocks configured by arranging the green pixels 100b and the green pixels 100c in two rows and two columns are referred to as a green pixel block 220 and a green pixel block 230, respectively. A pixel block configured by arranging the blue pixels 100d in two rows and two columns is referred to as a blue pixel block 240. Note that the pixel block can include n×n (an integer of two or more) pixels 100.

A plurality of adjacent pixel blocks is collectively referred to as a pixel group. The color filters of the same color are disposed in the pixels of the pixel group. The drawing illustrates an example of a pixel group including four pixel blocks arranged in two rows and two columns. A pixel group configured by arranging the red pixel blocks 210 in two rows and two columns is referred to as a red pixel group 310. Pixel groups configured by arranging the green pixel block 220 and the green pixel block 230 in two rows and two columns are referred to as a green pixel group 320 and a green pixel group 330, respectively. A pixel group configured by arranging the blue pixel blocks 240 in two rows and two columns is referred to as a blue pixel group 340. The red pixel group 310, the green pixel groups 320 and 330, and the blue pixel group 340 are arranged in a Bayer array. Note that the pixel group can include n×n (n is an integer of two or more) pixel blocks.

The imaging element 10 including the pixel array unit 11 in the drawing can adjust a resolution of an image to be captured. When an image signal for each pixel 100 is output, the highest resolution can be obtained. When an image signal for each pixel block is output, a middle resolution is obtained. When an image signal for each pixel group is output, the lowest resolution can be obtained. Such a sensitivity difference between the pixels 100 in the pixel group becomes a problem in the imaging element 10. This is because an image quality when the resolution is switched is deteriorated.

[Sensitivity of Pixel]

FIGS. 3A to 3D are diagrams each illustrating an example of sensitivity of pixels according to an embodiment of the present disclosure. FIGS. 3A to 3D are diagrams for describing variations in sensitivity of the pixels 100 in the pixel group. The sensitivity of the pixel 100 varies due to variations in manufacturing processes and an influence of the pixels 100 of another adjacent pixel group.

Figures 3A, 3B, 3C, 3D:
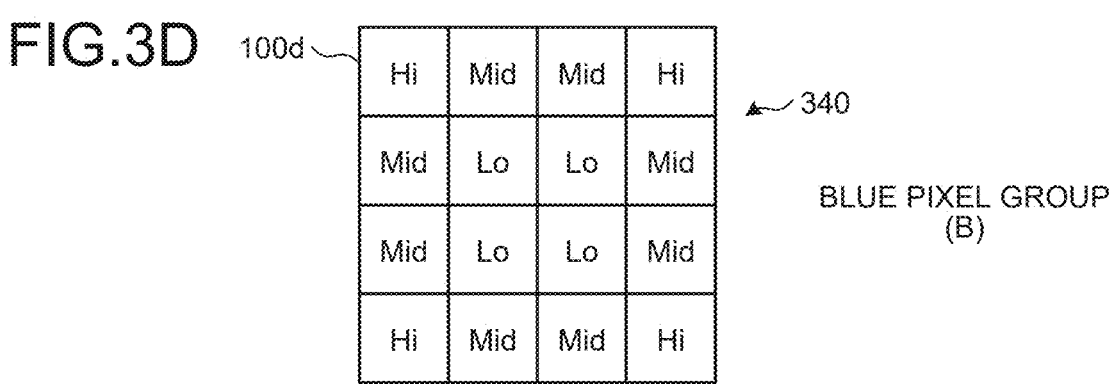
FIG. 3A is a diagram illustrating an example of sensitivity of pixels according to an embodiment of the present disclosure.
FIG. 3B is a diagram illustrating an example of sensitivity of pixels according to an embodiment of the present disclosure.
FIG. 3C is a diagram illustrating an example of sensitivity of pixels according to an embodiment of the present disclosure.
FIG. 3D is a diagram illustrating an example of sensitivity of pixels according to an embodiment of the present disclosure.

FIG. 3A is a diagram illustrating variations in sensitivity of the red pixels 100a of the red pixel group 310. In the figure, "Lo" represents relatively low sensitivity, "Mid" represents medium sensitivity, and "Hi" represents relatively high sensitivity. As illustrated in the drawing, the red pixels 100a at the center have low sensitivity, and the red pixels 100a at the corners have high sensitivity. The red pixels 100a at the sides have medium sensitivity.

FIG. 3B is a diagram illustrating variations in sensitivity of the green pixels 100b of the green pixel group 320. As illustrated in the drawing, the green pixels 100b at the upper and lower sides have low sensitivity, and the eight green pixels 100b in the central lateral direction have relatively high sensitivity.

FIG. 3C is a diagram illustrating variations in sensitivity of the green pixels 100c of the green pixel group 330. As illustrated in the drawing, the green pixels 100c at the right and left sides have low sensitivity, and the eight green pixels 100c in a central vertical direction have relatively high sensitivity.

FIG. 3D is a diagram illustrating variations in sensitivity of the blue pixels 100d of the blue pixel group 340. As illustrated in the drawing, the blue pixels 100d at the center have low sensitivity, and the blue pixels 100d at the corners have high sensitivity. The blue pixels 100d at the sides have medium sensitivity.

As described above, different variations in sensitivity occur in each pixel group. Therefore, the sensitivity is adjusted for each pixel group. The sensitivity can be adjusted by adjusting the on-chip lens. The sensitivity can also be adjusted by arranging a light-shielding wall that shields incident light incident on the pixel 100 and adjusting the light-shielding wall. Next, an example of a case of adjusting the on-chip lens will be described.

[Arrangement of On-Chip Lenses]

Figure 4:
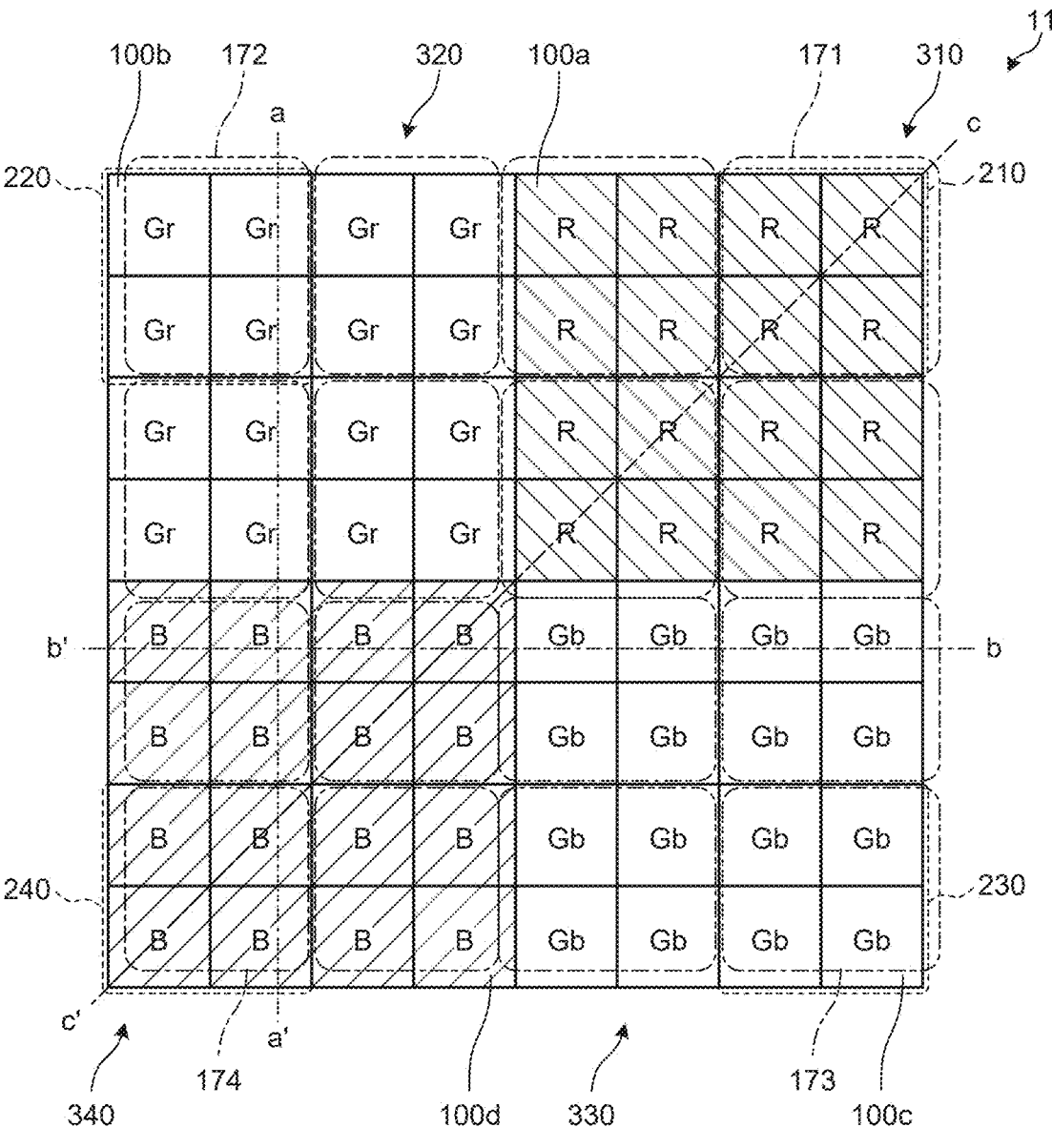
FIG. 4 is a diagram illustrating a configuration example of pixels according to a first embodiment of the present disclosure.

FIG. 4 is a diagram illustrating a configuration example of pixels according to a first embodiment of the present disclosure. FIG. 4 is a plan view illustrating an example of on-chip lenses arranged in the pixel blocks. As described above, the on-chip lens is disposed for each pixel block. A region indicated by an alternate long and short dash line in the drawing represents an on-chip lens. The on-chip lens can have a substantially rectangular shape in plan view. The drawing illustrates an example in which the corners of the on-chip lens are configured by curves. The drawing illustrates an example in which the on-chip lens has a shape in contact with another adjacent on-chip lens is illustrated. An on-chip lens 171 is disposed in the red pixel group 310. An on-chip lens 172 is disposed in the green pixel block 220. An on-chip lens 173 is disposed in the green pixel block 230. An on-chip lens 174 is disposed in the blue pixel block 240.

The on-chip lens 171 of the red pixel block 210 can have a shape protruding to the regions of the green pixel groups 320 and 330. That is, the on-chip lens 171 can have a shape covering the region of the pixels 100 of the adjacent green pixel groups 320 and 330. The on-chip lens 172 of the green pixel group 320 can have a shape protruding to the region of the blue pixel group 340. The on-chip lens 173 of the green pixel group 330 can have a shape protruding to the region of the blue pixel group 340. The on-chip lens 174 of the blue pixel group 340 can have a shape reduced inward of the pixel group.

By forming the on-chip lens 172 of the green pixel group 320 in a shape protruding to the upper and lower regions of the blue pixel group 340, it is possible to widen a condensing range of the incident light of the green pixels 100b in the upper and lower side portions of the green pixel group 320, and to increase the sensitivity. The on-chip lens 172 of the green pixel group 320 is configured to be reduced in the right direction and the left direction adjacent to the red pixel group 310. As a result, the sensitivity of the green pixels 100b in the center of the left and right sides of the green pixel group 320 can be decreased. This makes it possible to reduce variations in sensitivity illustrated in FIG. 3B.

By forming the on-chip lens 173 of the green pixel group 330 in a shape protruding to the regions of the left and right blue pixel groups 340, the light condensing range of the incident light of the green pixels 100c at the right and left sides of the green pixel group 330 can be widened, and the sensitivity can be increased. The on-chip lens 173 of the green pixel group 330 is configured to be reduced in the upper direction and the lower direction adjacent to the red pixel group 310. As a result, the sensitivity of the green pixels 100c in the center of the upper and lower sides of the green pixel group 330 can be decreased. This makes it possible to reduce variations in sensitivity illustrated in FIG. 3C.

[Configuration of Pixels]

Figure 5:
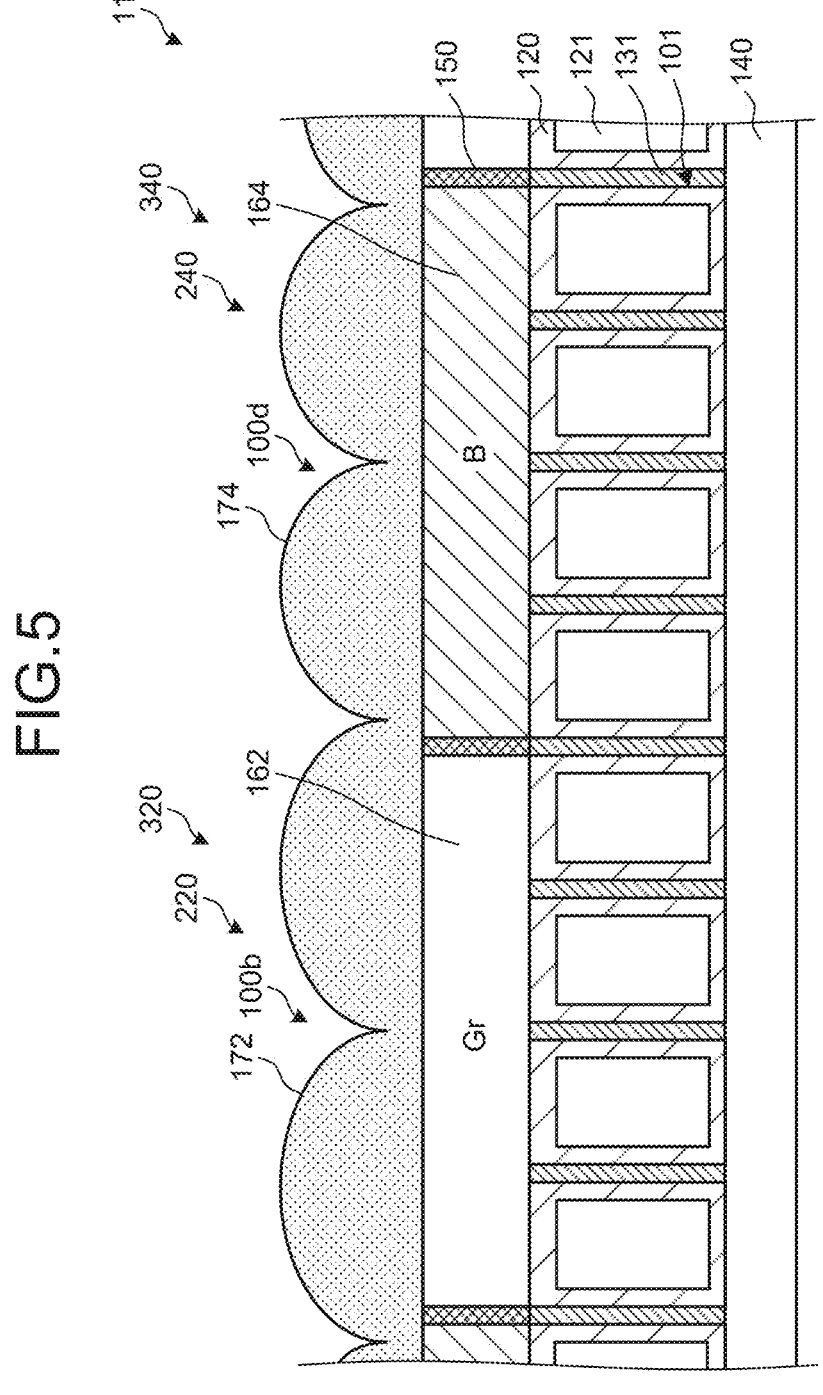
FIG. 5 is a diagram illustrating a configuration example of pixels according to the first embodiment of the present disclosure.

FIG. 5 is a diagram illustrating a configuration example of pixels according to the first embodiment of the present disclosure. The drawing is a sectional view illustrating a configuration example of the pixels 100. The drawing is a sectional view taken along line a-a' in FIG. 4. The drawing illustrates the green pixels 100b of the green pixel block 220 of the green pixel group 320 and the blue pixels 100d of the blue pixel block 240 of the blue pixel group 340. The configuration of the pixel 100 will be described using the blue pixel 100d as an example. The blue pixel 100d includes a semiconductor substrate 120, a wiring region 140, a separator 131, and the color filter 164.

The semiconductor substrate 120 is a semiconductor substrate on which a diffusion layer of a semiconductor element of the pixel 100 is disposed. The semiconductor substrate 120 can include, for example, silicon (Si). The semiconductor element and the like are disposed in a well region formed in the semiconductor substrate 120. For convenience, the semiconductor substrate 120 in the drawing is assumed to be configured in a p-type well region. The semiconductor element can be formed by disposing an n-type or p-type semiconductor region in the p-type well region. A photoelectric converter 101 has been illustrated as an example on the semiconductor substrate 120 in the drawing. The photoelectric converter 101 includes an n-type semiconductor region 121. Specifically, a photodiode including a pn junction at an interface between the n-type semiconductor region 121 and the surrounding p-type well region corresponds to the photoelectric converter 101.

The wiring region 140 is a region that is disposed on a front surface of the semiconductor substrate 120 and in which wiring of an element is formed. The wiring region 140 is a region where wiring for transmitting a signal to an element or the like of the semiconductor substrate 120 is formed.

The separator 131 is disposed at a boundary of the pixels 100 in the semiconductor substrate 120 to electrically and optically separate the pixel 100. The separator 131 can include an insulator embedded in the semiconductor substrate 120. The separator 131 can be formed, for example, by disposing an insulator such as SiO₂ in a groove penetrating the semiconductor substrate 120 formed at the boundary of the pixels 100. Note that the separator 131 can also have a shape reaching near the center of the semiconductor substrate 120 from a back surface of the semiconductor substrate 120 (not penetrating the semiconductor substrate 120).

The color filter is an optical filter that transmits incident light having a predetermined wavelength among the incident light. As the color filter, for example, a color filter that transmits red light, green light, and blue light can be used. The pixel 100 generates an image signal of incident light having a wavelength to which the color filter corresponds. As described above, the color filters 161, 162, 163, and 164 are respectively disposed in the red pixel 100a, the green pixel 100b, the green pixel 100c, and the blue pixel 100d.

Note that, in the pixel 100 in the drawing, a light-shielding wall 150 is disposed in the region of the color filter at the boundary of the pixel group. The light-shielding wall 150 shields incident light. By arranging the light-shielding wall 150, it is possible to shield incident light obliquely incident from the adjacent pixel 100.

The on-chip lens is a lens commonly disposed in the plurality of pixels 100 constituting the pixel block 210 and the like as described above. The on-chip lenses in the drawing has a hemispherical cross section and condenses incident light on a photoelectric converter. The on-chip lens can include an organic material such as an acrylic resin or an inorganic material such as silicon nitride (SiN). As described above, the on-chip lens 172 is disposed in the green pixel block 220, and the on-chip lens 174 is disposed in the blue pixel block 240.

As illustrated in the drawing, the on-chip lens 172 of the green pixel block 220 has a shape in which an end protrudes in the region of the blue pixel 100d of the blue pixel group 340.

Figure 6:
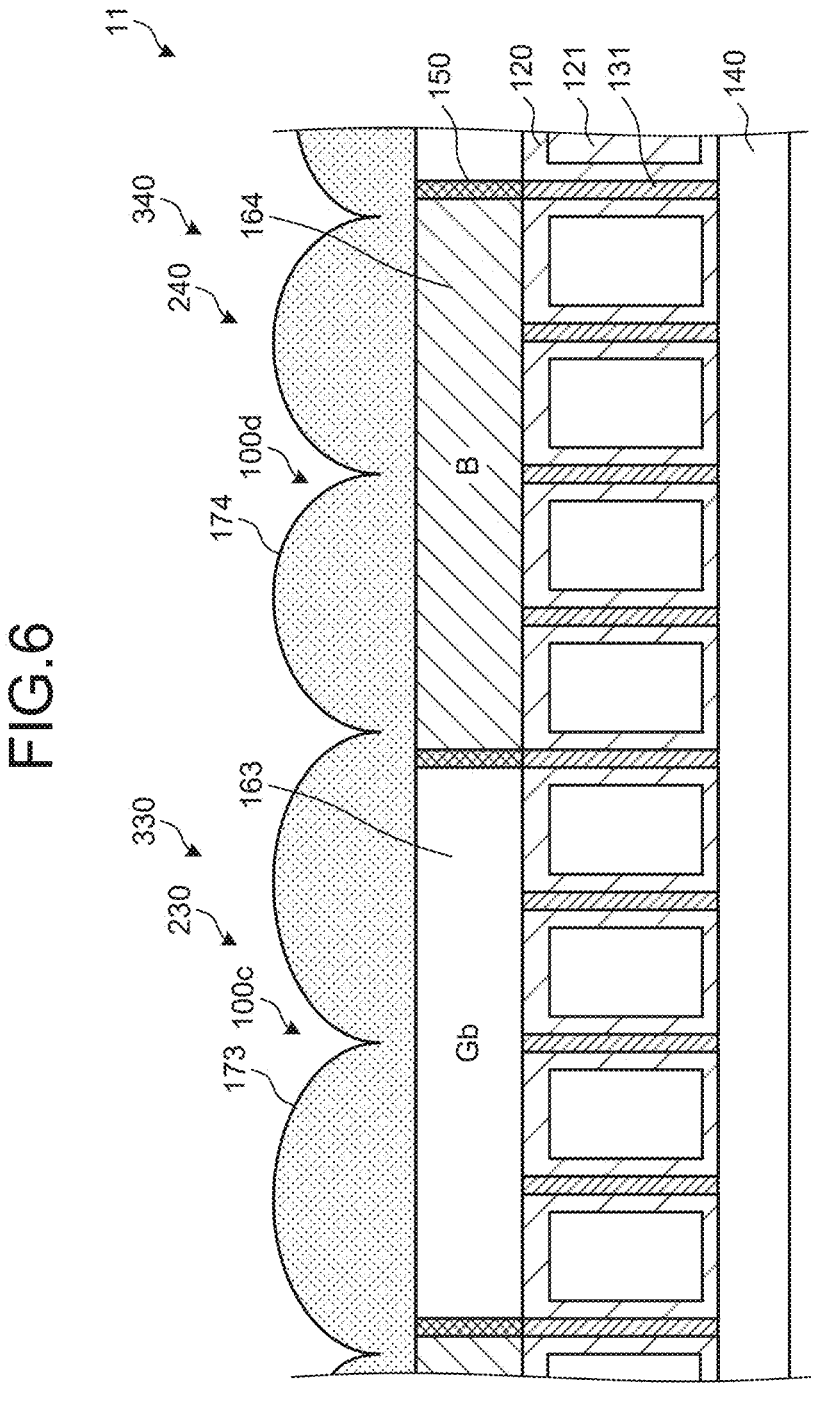
FIG. 6 is a diagram illustrating a configuration example of pixels according to the first embodiment of the present disclosure.

FIG. 6 is a diagram illustrating a configuration example of pixels according to the first embodiment of the present disclosure. The drawing is a sectional view illustrating a configuration example of the pixels 100, similarly to FIG. 5. The drawing is a sectional view taken along line b-b' in FIG. 4. The drawing illustrates the green pixels 100c of the green pixel block 230 of the green pixel group 330 and the blue pixels 100d of the blue pixel block 240 of the blue pixel group 340.

As illustrated in the drawing, the on-chip lens 173 of the green pixel block 230 has a shape in which an end protrudes in the region of the blue pixel 100d of the blue pixel group 340.

Figure 7:
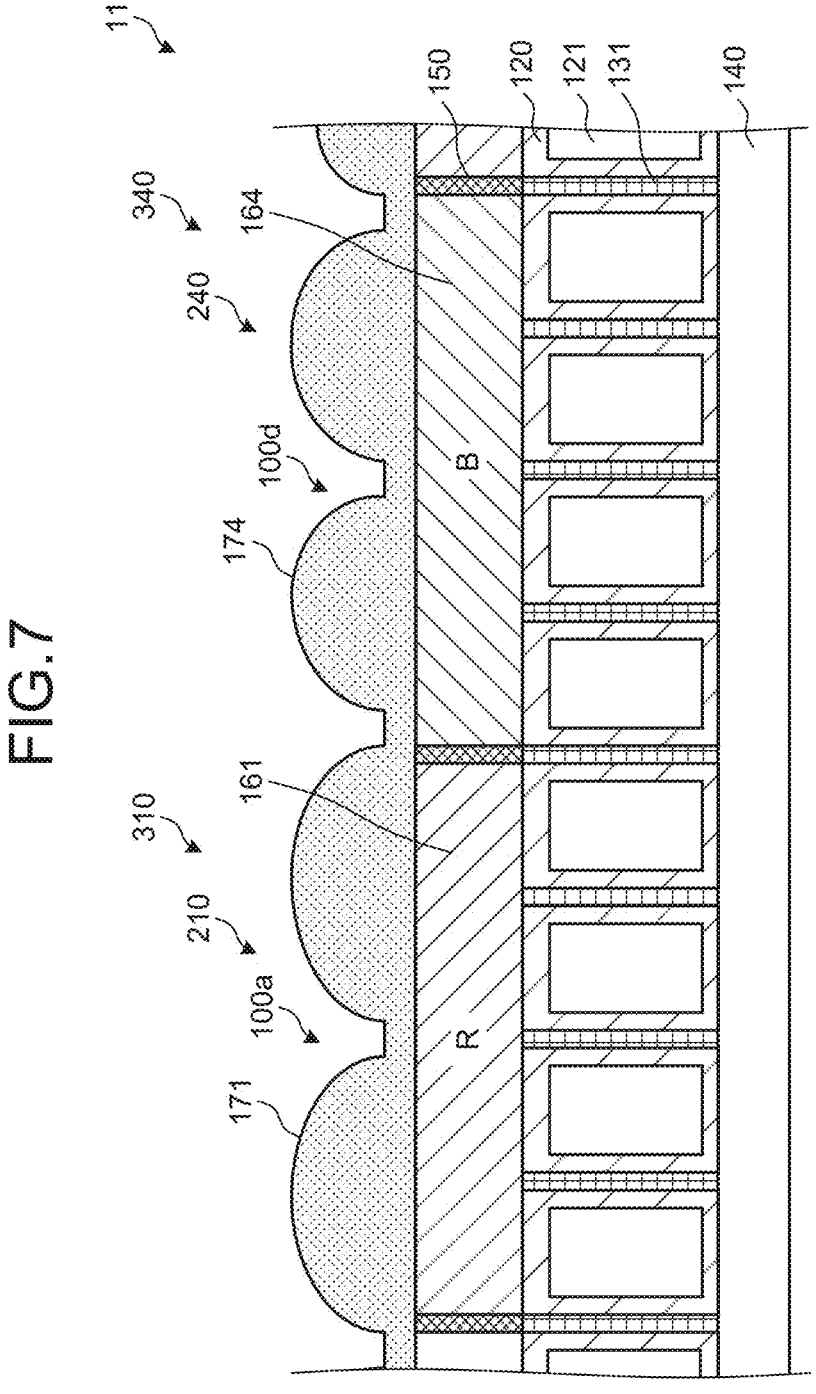
FIG. 7 is a diagram illustrating a configuration example of pixels according to the first embodiment of the present disclosure.

FIG. 7 is a diagram illustrating a configuration example of pixels according to the first embodiment of the present disclosure. The drawing is a sectional view illustrating a configuration example of the pixels 100, similarly to FIG. 5. The drawing is a sectional view taken along line c-c' in FIG. 4. The drawing illustrates the red pixels 100a of the red pixel block 210 of the red pixel group 310 and the blue pixels 100d of the blue pixel block 240 of the blue pixel group 340.

As illustrated in the drawing, the on-chip lens 171 of the red pixel block 210 has a shape in which an end protrudes in the region of the blue pixel 100d of the blue pixel group 340.

Figure 8:
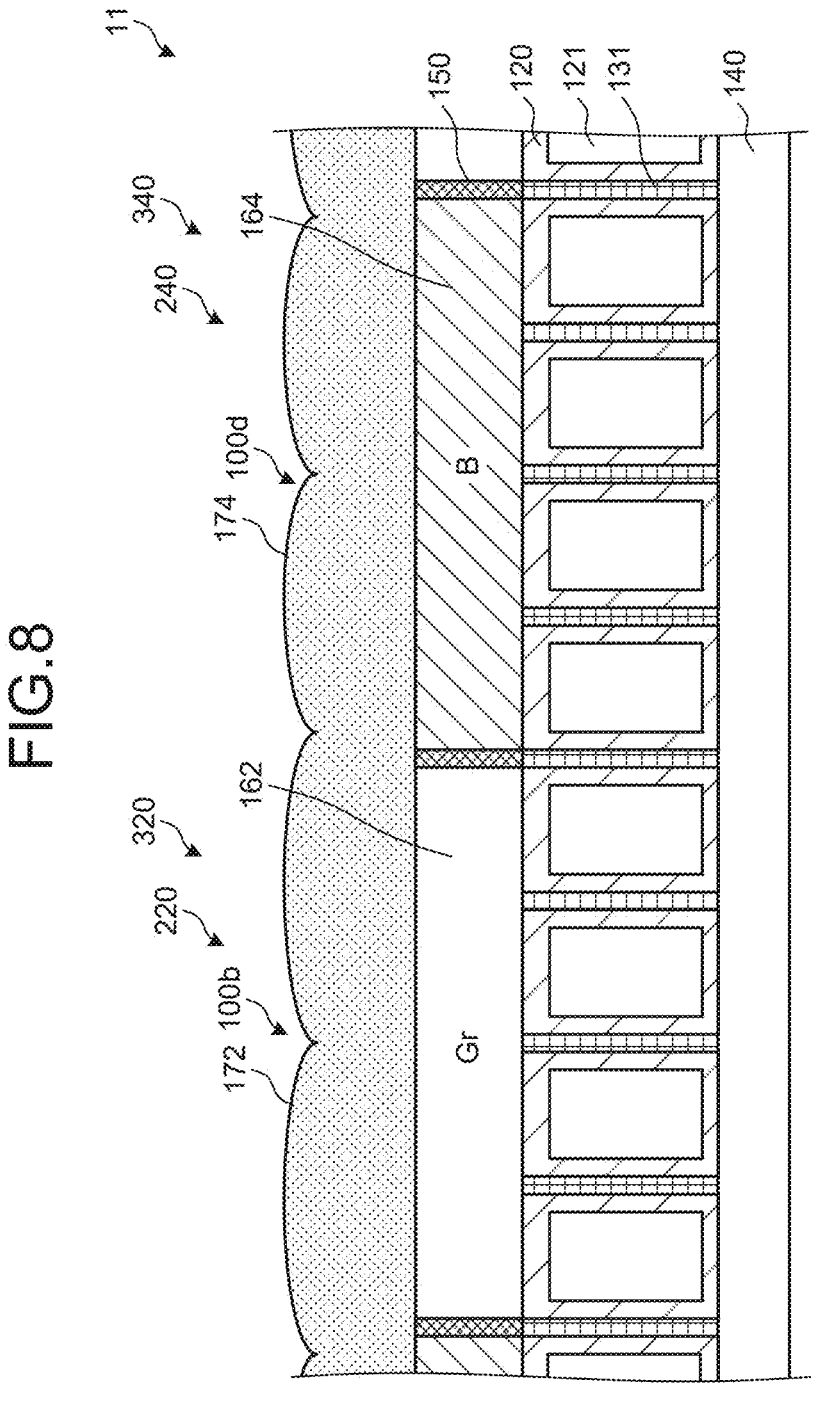
FIG. 8 is a diagram illustrating a configuration example of pixels according to a second embodiment of the present disclosure.

FIG. 8 is a diagram illustrating a configuration example of pixels according to the first embodiment of the present disclosure. The drawing is a sectional view illustrating a configuration example of the pixels 100, similarly to FIG. 5. The drawing illustrates a configuration of the pixel 100 in a peripheral edge of the pixel array unit 11. Since the peripheral edge of the pixel array unit 11 has a high image height, the on-chip lens 172 and the like have a shape having a small curvature. In this manner, the curvature of the on-chip lens 172 and the like can be adjusted in accordance with the image height.

[Other Configurations of Pixels]

Figure 9:
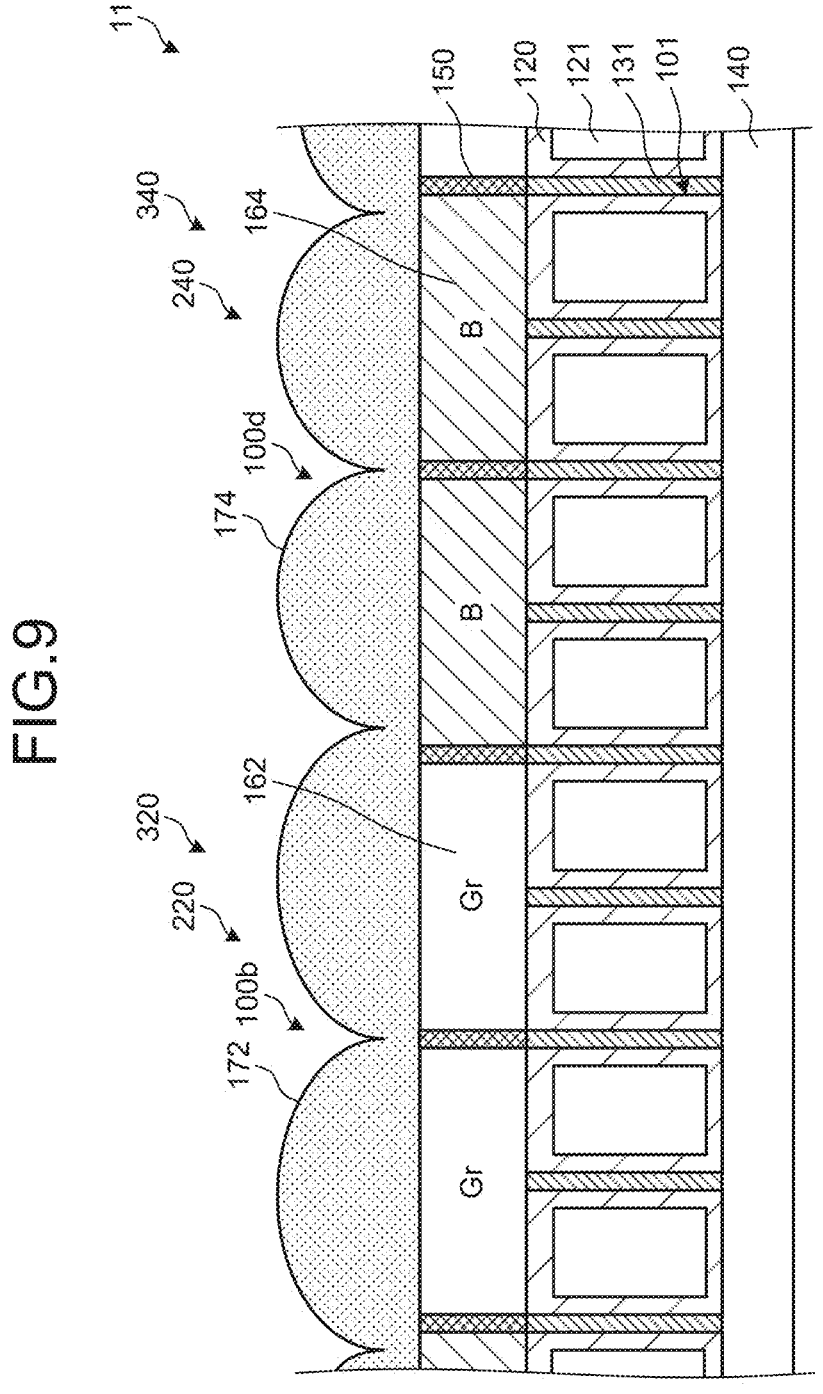
FIG. 9 is a diagram illustrating another configuration example of pixels according to the first embodiment of the present disclosure.

FIG. 9 is a diagram illustrating another configuration example of pixels according to the first embodiment of the present disclosure. The drawing is a sectional view illustrating a configuration example of the pixels 100, similarly to FIG. 5. The drawing illustrates an example of a case where the light-shielding wall 150 is disposed in the region of the color filter at a boundary of the pixel block (the pixel block 220 or the like). Note that the light-shielding wall 150 can also be disposed in the region of the color filter at the boundary of the pixels (the pixels 100b or the like).

Figure 10:
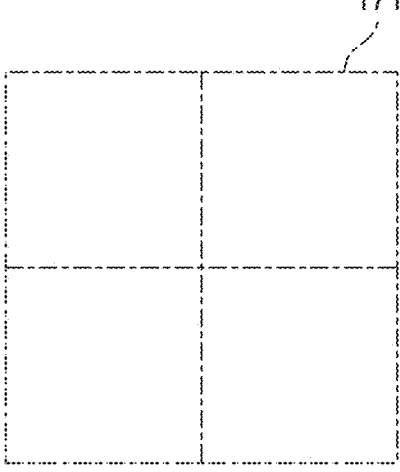
FIG. 10 is a diagram illustrating another configuration example of an on-chip lens according to the first embodiment of the present disclosure.

FIG. 10 is a diagram illustrating another configuration example of an on-chip lens according to the first embodiment of the present disclosure. The drawing illustrates an example of an on-chip lens having a rectangular shape in plan view.

As described above, the imaging element 10 according to the first embodiment of the present disclosure adjusts the shape and the like of the on-chip lens for each pixel block. This makes it possible to reduce variations in sensitivity of the pixels 100 in the pixel group.

2. Second Embodiment

The imaging element 10 according to the first embodiment described above uses an on-chip lens having a substantially rectangular shape. On the other hand, an imaging element 10 according to a second embodiment of the present disclosure is different from the first embodiment in that an on-chip lens provided with a recess is used.

[Arrangement of On-Chip Lenses]

Figure 11:
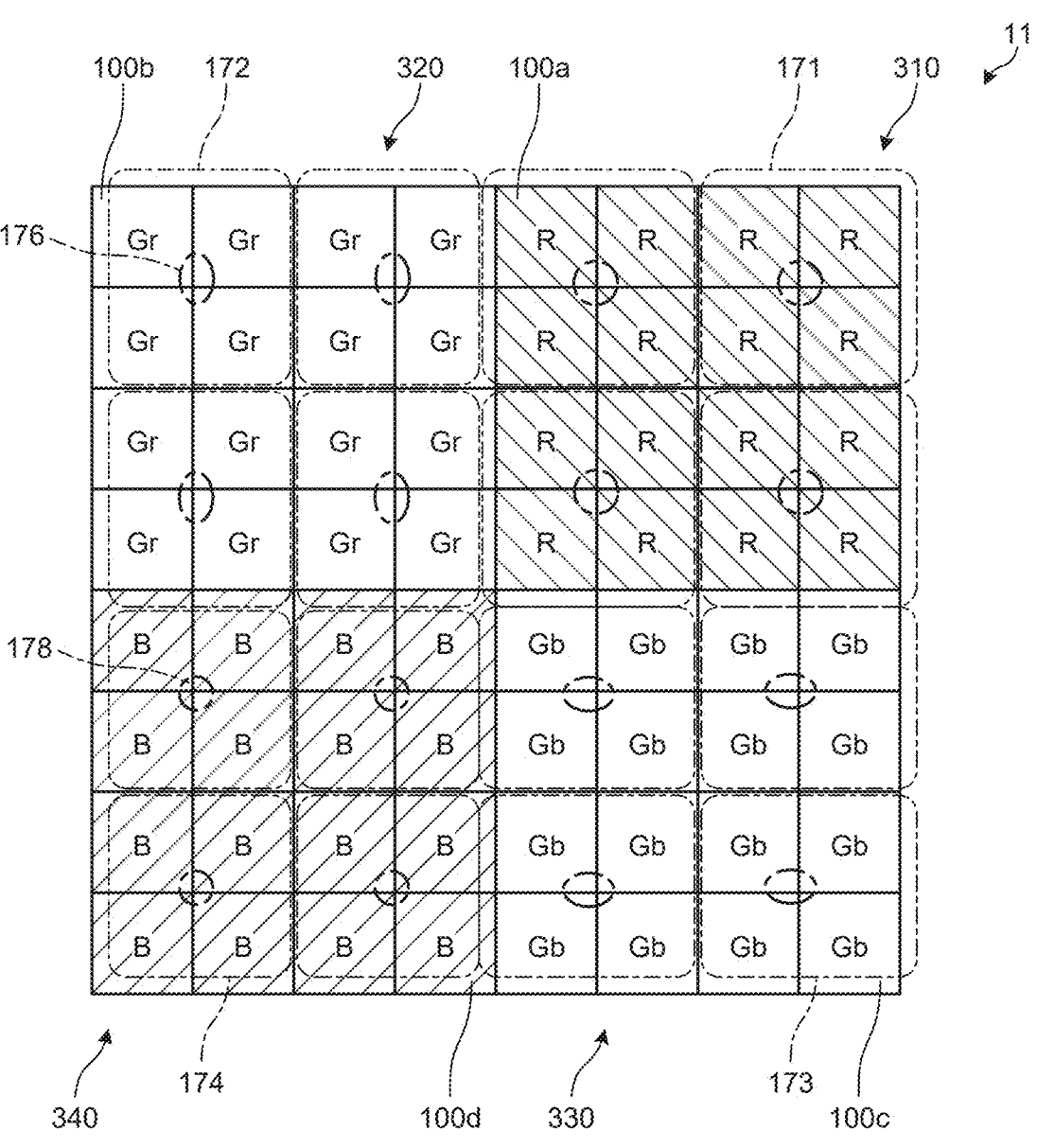
FIG. 11 is a diagram illustrating a configuration example of pixels according to the second embodiment of the present disclosure.

FIG. 11 is a diagram illustrating a configuration example of pixels according to the second embodiment of the present disclosure. Similarly to FIG. 4, the drawing is a plan view illustrating an example of the on-chip lenses arranged in the pixel blocks. The on-chip lens 172 and the like in the drawing are different from the on-chip lens 172 and the like in FIG. 4 in that a recess 176 is disposed at a center.

By forming the recess 176 and the like in the on-chip lens 172 and the like, a condensing degree of the on-chip lens 172 and the like is adjusted. For example, in a pixel block having a large variation in sensitivity, the range of the recess 176 and the like of the on-chip lens is widened to reduce the condensing degree. This makes it possible to adjust variations in sensitivity of the pixels 100 in the pixel block.

[Configuration of Pixels]

Figure 12:
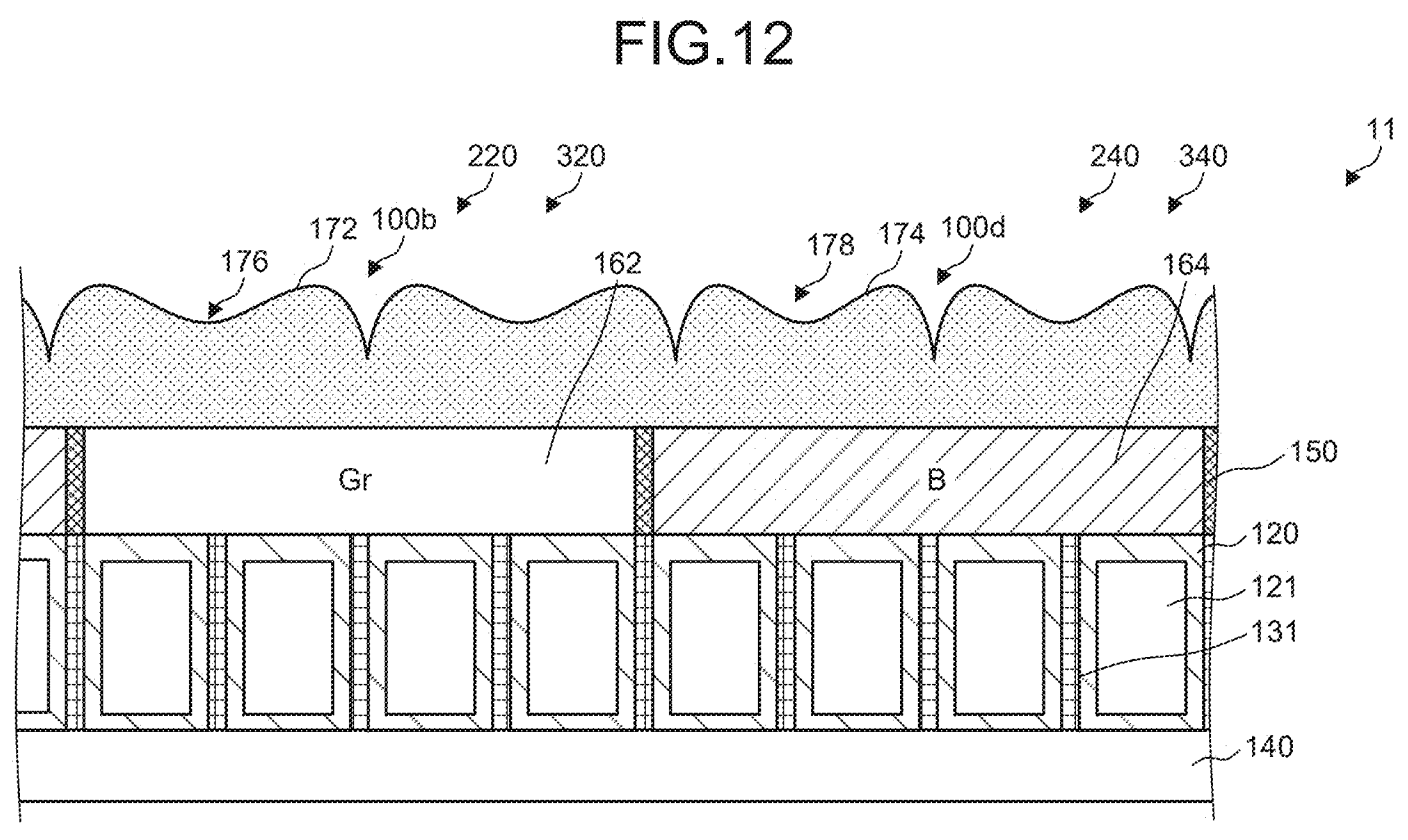

FIG. 12 is a diagram illustrating a configuration example of pixels according to the second embodiment of the present disclosure. The drawing is a sectional view illustrating a configuration example of the pixels 100, similarly to FIG. 5. In the on-chip lens 172 in the drawing, a recess 176 is disposed. In the on-chip lens 174 in the drawing, a recess 178 is disposed.

The configuration of the imaging element 10 other than the above configuration is similar to the configuration of the imaging element 10 according to the first embodiment of the present disclosure, and thus will not be described.

As described above, in the imaging element 10 according to the second embodiment of the present disclosure, variations in sensitivity can be further adjusted by forming the recess 176 and the like in the on-chip lens 172 and the like.

3. Third Embodiment

The imaging element 10 according to the first embodiment described above adjusts the size of the on-chip lens in plan view. On the other hand, an imaging element 10 according to a third embodiment of the present disclosure is different from the first embodiment in that the height of the on-chip lens is adjusted.
[Configuration of Pixels]

Figure 13:
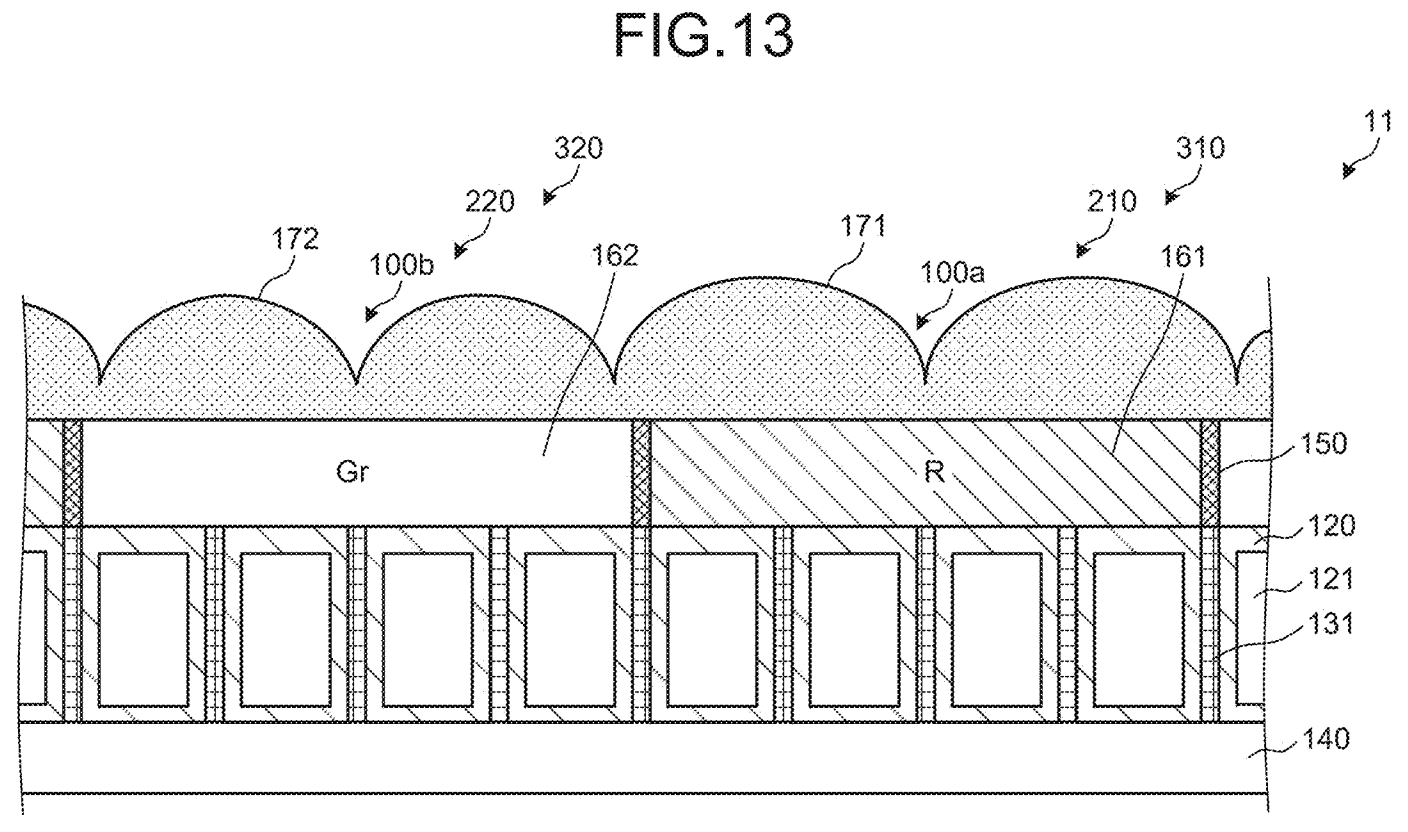

FIG. 13 is a diagram illustrating a configuration example of pixels according to the third embodiment of the present disclosure. The drawing illustrates the green pixels 100b of the green pixel block 220 of the green pixel group 320 and the red pixels 100a of the red pixel block 210 of the red pixel group 310. As illustrated in the drawing, the on-chip lens 172 can have a lower height than the on-chip lens 171. By adjusting the height of the on-chip lens 172, a condensing spot can be adjusted, and the variation in sensitivity can be adjusted.

Figure 14:
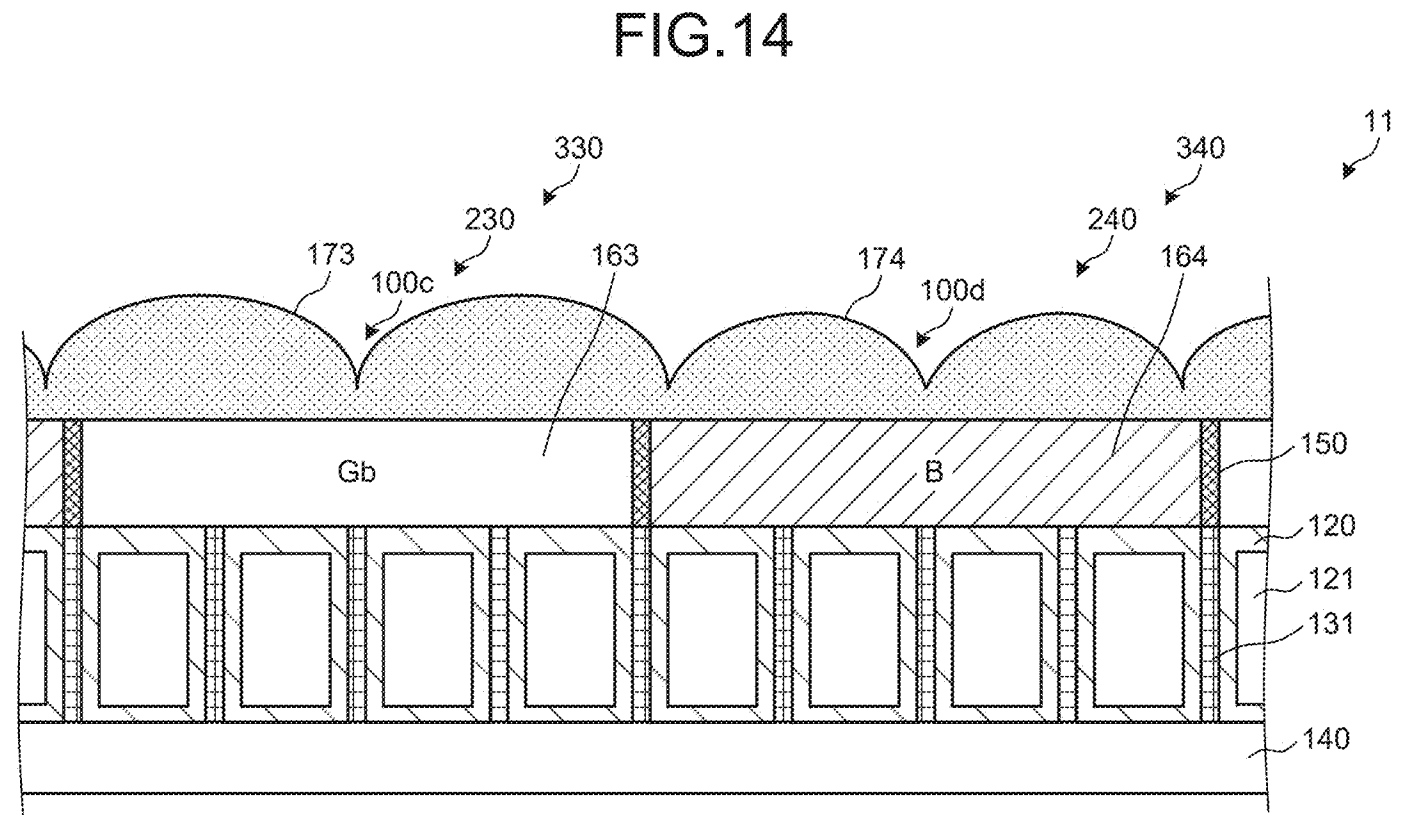

FIG. 14 is a diagram illustrating a configuration example of pixels according to the third embodiment of the present disclosure. The drawing illustrates the green pixels 100c of the green pixel block 230 of the green pixel group 330 and the blue pixels 100d of the blue pixel block 240 of the blue pixel group 340. As illustrated in the drawing, the on-chip lens 174 can have a lower height than the on-chip lens 173. Note that the on-chip lens 173 can have the same height as the on-chip lens 172.

The configuration of the imaging element 10 other than the above configuration is similar to the configuration of the imaging element 10 according to the first embodiment of the present disclosure, and thus will not be described.

As described above, the imaging element 10 according to the third embodiment of the present disclosure can further adjust the variation in sensitivity by adjusting the height of the on-chip lens 172 and the like.

4. Fourth Embodiment

In the imaging element 10 according to the first embodiment described above, the on-chip lens is adjusted. On the other hand, an imaging element 10 according to a fourth embodiment of the present disclosure is different from the first embodiment in that the light-shielding wall is adjusted.
[Configuration of Imaging Element in Plane]

Figure 15:
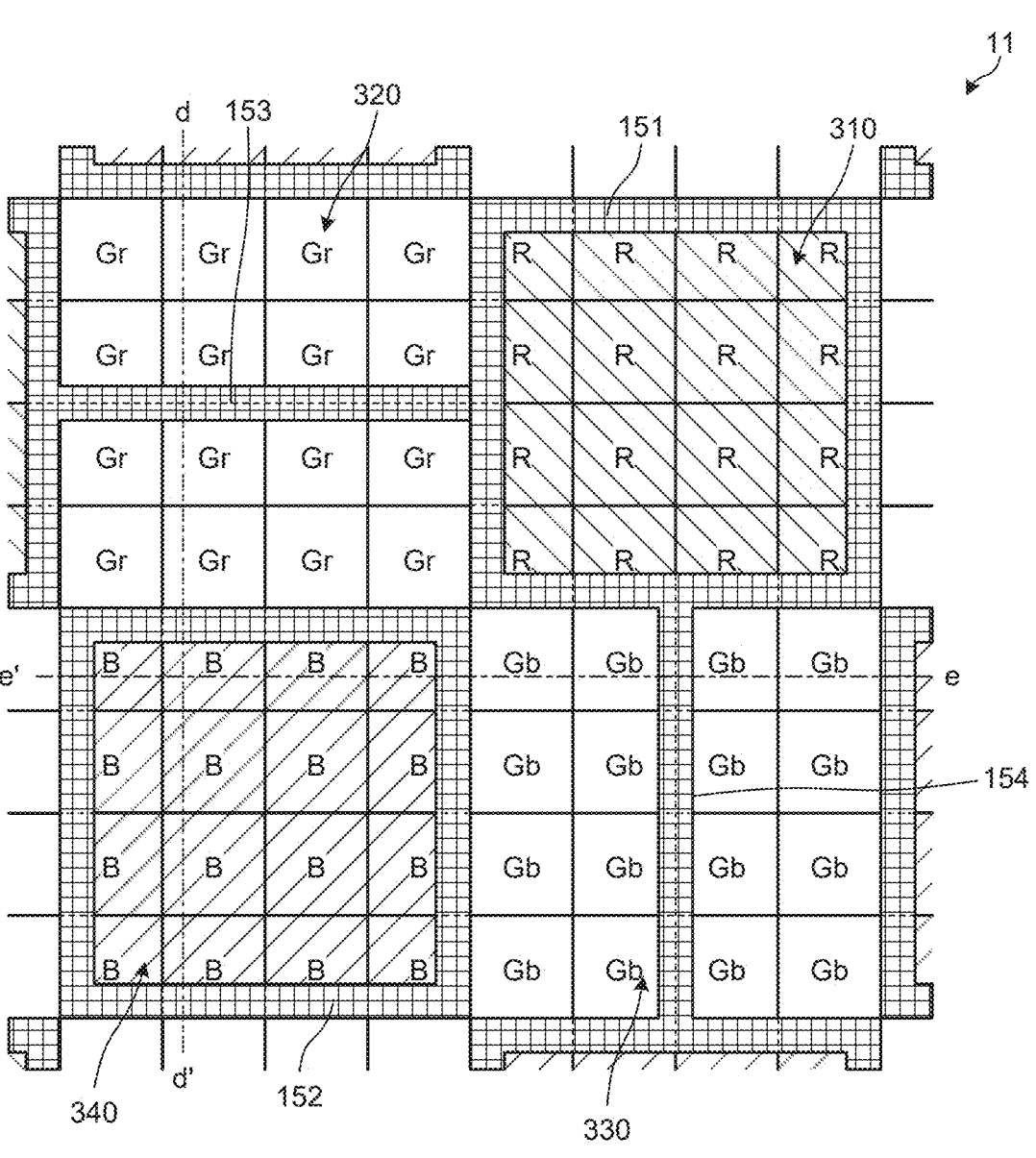
FIG. 15 is a diagram illustrating a configuration example of pixels according to a fourth embodiment of the present disclosure.

FIG. 15 is a diagram illustrating a configuration example of pixels according to the fourth embodiment of the present disclosure. The drawing is a plan view illustrating a configuration example of the pixels 100, similarly to FIG. 4. The pixel 100 is different from the pixel in FIG. 4 in that a light-shielding wall 151 and the like are disposed in the red pixel group 310, the green pixel group 320, the green pixel group 330, and the blue pixel group 340 in FIG. 15.

In the red pixel group 310 in the drawing, the light-shielding wall 151 is disposed in the red pixel 100a in an outer periphery. The light-shielding wall 151 is a light-shielding wall having a width wider than the light-shielding wall 150 described in FIG. 5 in plan view. For example, when the light-shielding wall 150 has a width of 10 nm, the light-shielding wall 151 can have a width of 20 nm. As a result, the sensitivity of the red pixels 100a in the outer periphery of the red pixel group 310 can be decreased.

In the green pixel group 320 in the drawing, the light-shielding wall 153 is disposed in the center lateral direction. The light-shielding wall 153 can have the same width as the light-shielding wall 151. By arranging the light-shielding wall 153, the sensitivity of the eight green pixels 100b in the central lateral direction of the green pixel group 320 can be decreased.

In the green pixel group 330 in the drawing, the light-shielding wall 154 is disposed in the central vertical direction. The light-shielding wall 154 can have the same width as the light-shielding wall 151. By arranging the light-shielding wall 154, the sensitivity of the eight green pixels 100c in the central vertical direction of the green pixel group 330 can be decreased.

In the blue pixel group 340 in the drawing, the light-shielding wall 152 is disposed in the blue pixel 100d in an outer periphery. The light-shielding wall 152 can also have the same width as the light-shielding wall 151. By arranging the light-shielding wall 152, the sensitivity of the blue pixel 100d in the outer periphery of the blue pixel group 340 can be decreased.

As illustrated in the drawing, the light-shielding wall disposed between the red pixel group 310 and the green pixel groups 320 and 330 can have a shape protruding in the region of the red pixel group 310. The light-shielding wall disposed between the blue pixel group 340 and the green pixel groups 320 and 330 can have a shape protruding in the region of the blue pixel group 340. The light-shielding wall 153 in a direction perpendicular to a direction adjacent to the blue pixel group 340 is disposed at the center of the green pixel group 320, and the light-shielding wall 154 in a direction perpendicular to the direction adjacent to the blue pixel group 340 is disposed at the center of the green pixel group 330. These light-shielding walls can reduce variations in sensitivity of the pixel 100.
[Configuration of Pixels]

Figure 16:
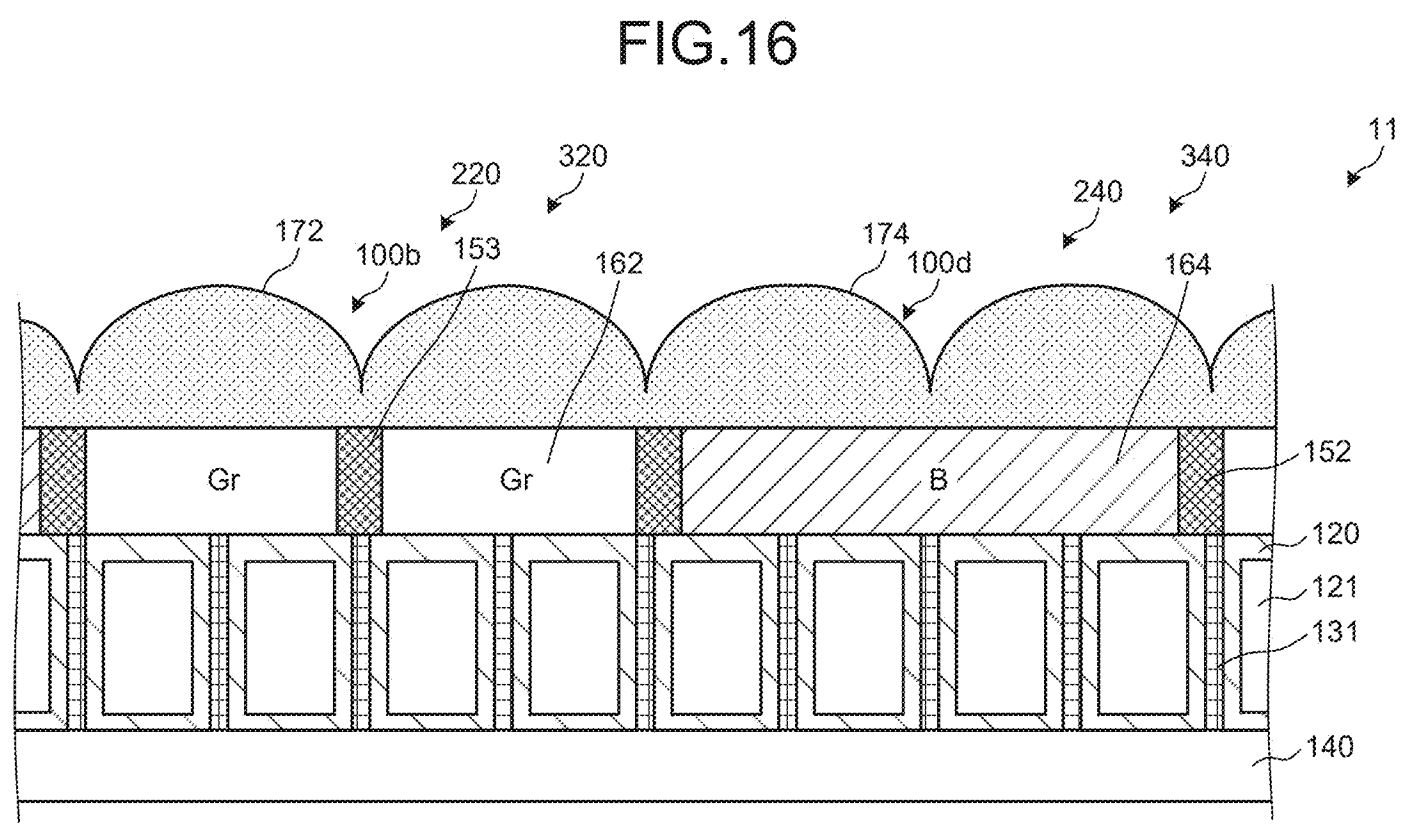

FIG. 16 is a diagram illustrating a configuration example of pixels according to the fourth embodiment of the present disclosure. The drawing is a sectional view illustrating a configuration example of the pixels 100, similarly to FIG. 5. The drawing illustrates the green pixels 100b of the green pixel block 220 of the green pixel group 320 and the blue pixels 100d of the blue pixel block 240 of the blue pixel group 340. The light-shielding wall 153 is disposed at the center of the green pixel block 220 in the drawing. The light-shielding wall 152 is disposed at a peripheral edge of the blue pixel group 340 in the drawing.

Figure 17:
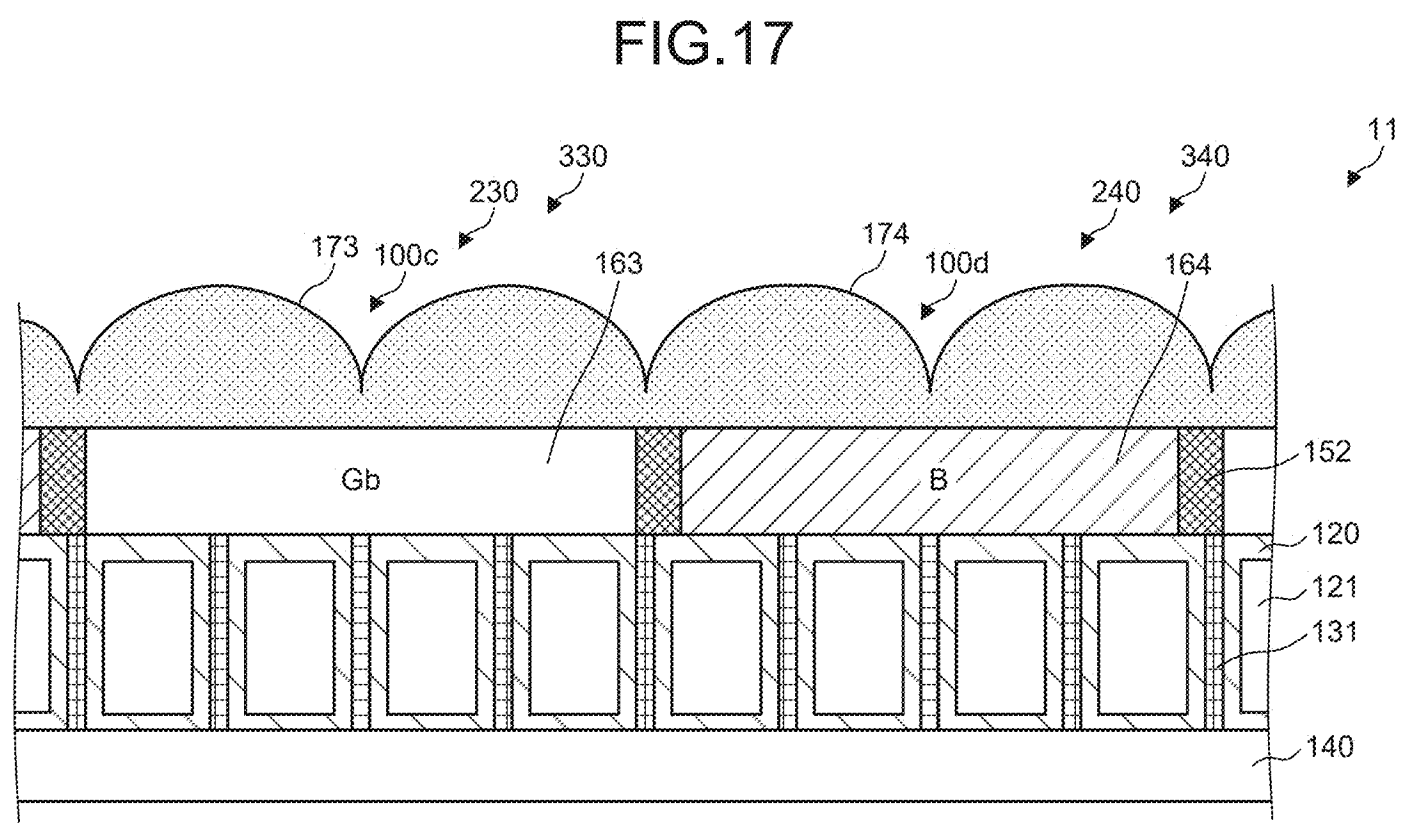

FIG. 17 is a diagram illustrating a configuration example of pixels according to the fourth embodiment of the present disclosure. The drawing is a sectional view illustrating a configuration example of the pixels 100, similarly to FIG. 6. The drawing illustrates the green pixels 100c of the green pixel block 230 of the green pixel group 330 and the blue pixels 100d of the blue pixel block 240 of the blue pixel group 340. The light-shielding wall 152 is disposed at the peripheral edge of the blue pixel group 340 in the drawing.
[Light-Shielding Wall]

FIGS. 18A to 18D are diagrams each illustrating a configuration example of the light-shielding wall according to the fourth embodiment of the present disclosure. The drawing is a sectional view illustrating a configuration example of the light-shielding wall 150. Note that the light-shielding walls 151 to 154 can also adopt a similar configuration. A protective film 139 is illustrated on the semiconductor substrate 120 in the drawing.

Figure 18A:
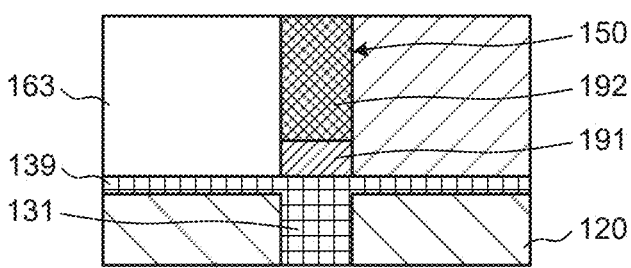
FIG. 18A is a diagram illustrating a configuration example of a light-shielding wall according to the fourth embodiment of the present disclosure.

FIG. 18A illustrates an example of the light-shielding wall 150 configured by stacking a light-shielding film 192 on a base 191. The base 191 can include titanium (Ti) or titanium nitride (TiN). The light-shielding film 192 in the drawing can include tungsten (W).

Figure 18B:
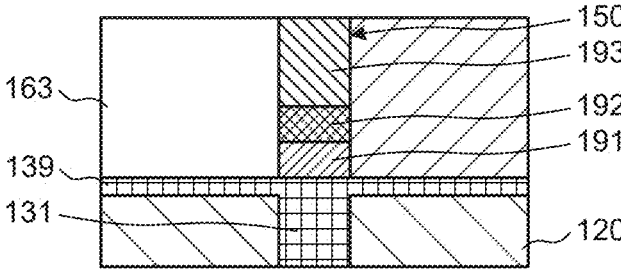
FIG. 18B is a diagram illustrating a configuration example of the light-shielding wall according to the fourth embodiment of the present disclosure.

FIG. 18B illustrates an example of the light-shielding wall 150 configured by stacking the base 191, the light-shielding film 192, and an oxide film 193. For example, SiO$_2$ can be used for the oxide film 193.

Figure 18C:
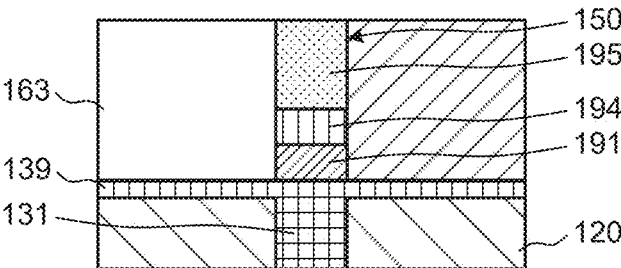
FIG. 18C is a diagram illustrating a configuration example of the light-shielding wall according to the fourth embodiment of the present disclosure.

FIG. 18C illustrates an example of the light-shielding wall 150 configured by stacking bases 191 and 194 and a low refractive index member 195.

Figure 18D:
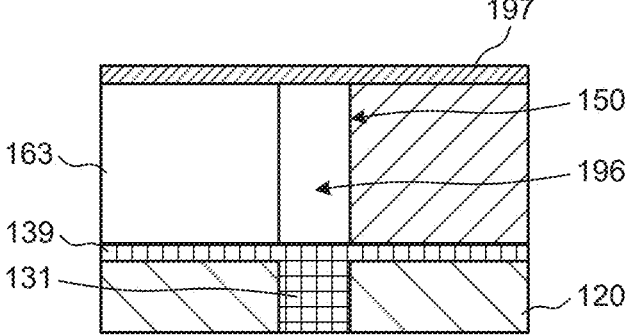
FIG. 18D is a diagram illustrating a configuration example of the light-shielding wall according to the fourth embodiment of the present disclosure.

FIG. 18D illustrates an example of the light-shielding wall 150 including a gap 196. A film 197 for sealing the gap 196 is disposed on the light-shielding wall 150 in the drawing.

[Another Configuration of Imaging Element]

Figure 19:
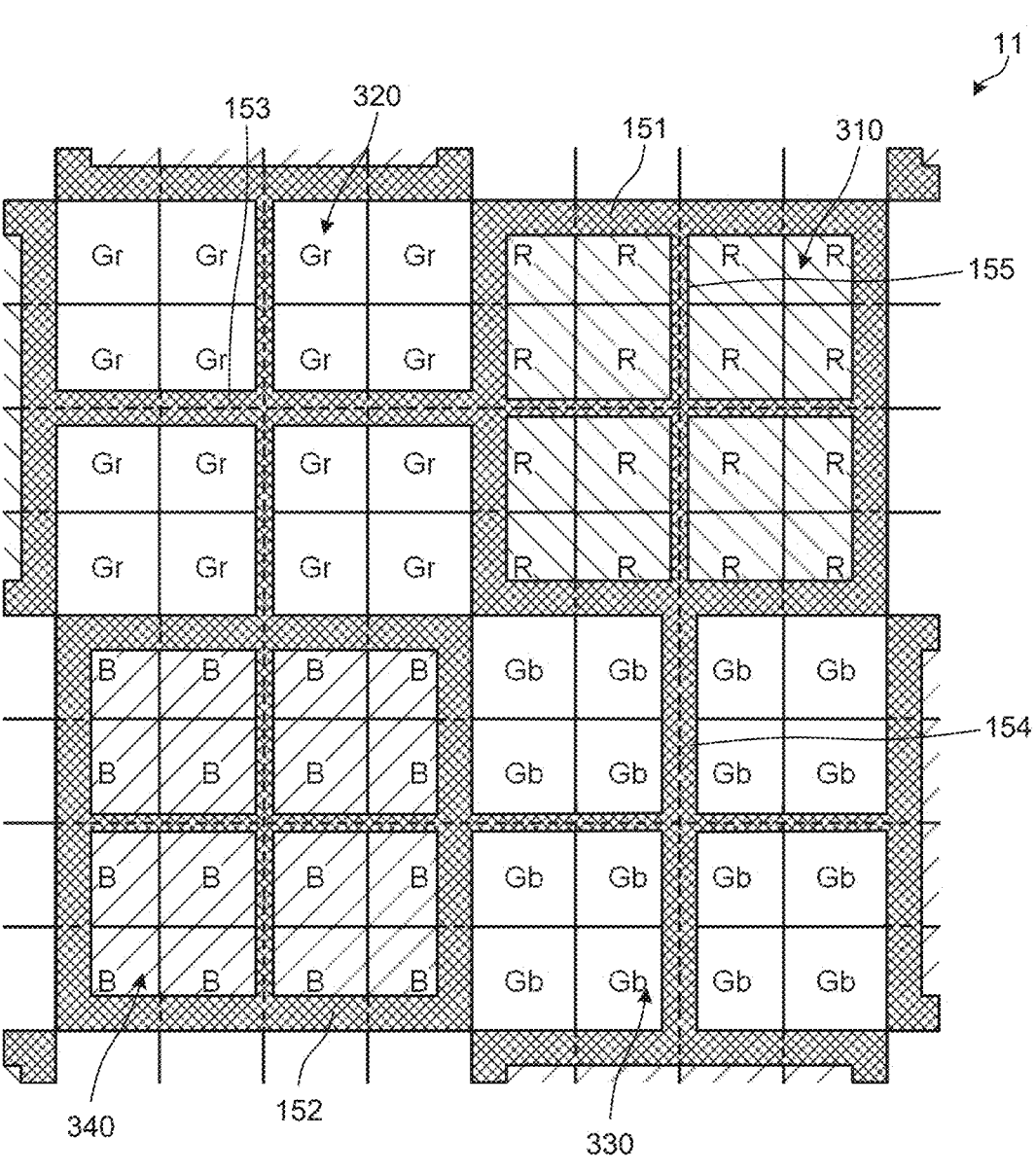
FIG. 19 is a diagram illustrating another configuration example of pixels according to the fourth embodiment of the present disclosure.

FIG. 19 is a diagram illustrating another configuration example of pixels according to the fourth embodiment of the present disclosure. The drawing illustrates an example in which a light-shielding wall is disposed around a pixel block. In the red pixel group 310 in the drawing, a light-shielding wall 155 is disposed between the adjacent red pixel blocks 210. The light-shielding wall 155 can have the same width as the light-shielding wall 150, for example. In the green pixel group 320 in the drawing, the light-shielding wall 155 is disposed in a portion where the light-shielding wall 153 is not disposed between the adjacent green pixel blocks 220. In the green pixel group 330 in the drawing, the light-shielding wall 155 is disposed in a portion where the light-shielding wall 154 is not disposed between the adjacent green pixel blocks 230. In the blue pixel group 340 in the drawing, the light-shielding wall 155 is disposed between the adjacent blue pixel blocks 240.

Figure 20:
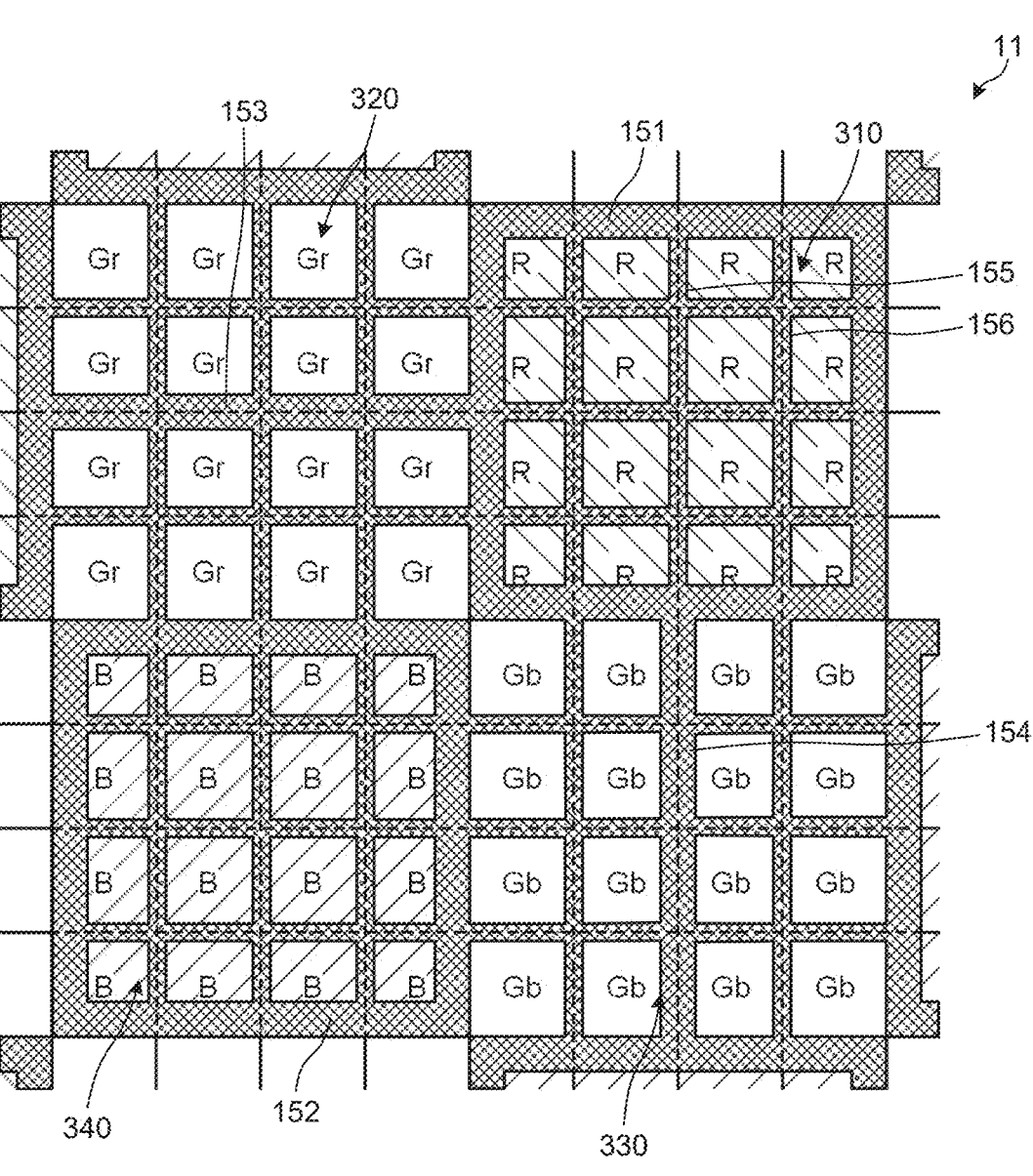
FIG. 20 is a diagram illustrating another configuration example of pixels according to the fourth embodiment of the present disclosure.

FIG. 20 is a diagram illustrating another configuration example of pixels according to the fourth embodiment of the present disclosure. The drawing illustrates an example in which a light-shielding wall is disposed around a pixel. In the red pixel block 210 in the drawing, a light-shielding wall 156 is disposed between the adjacent red pixels 100a. The light-shielding wall 156 can have the same width as the light-shielding wall 150, for example. In the green pixel block 220 in the drawing, the light-shielding wall 156 is disposed between the adjacent green pixels 100b. In the green pixel block 230 in the drawing, the light-shielding wall 156 is disposed between the adjacent green pixels 100c. In the blue pixel block 240 in the drawing, the light-shielding wall 156 is disposed between the adjacent blue pixels 100d.

Figure 21:
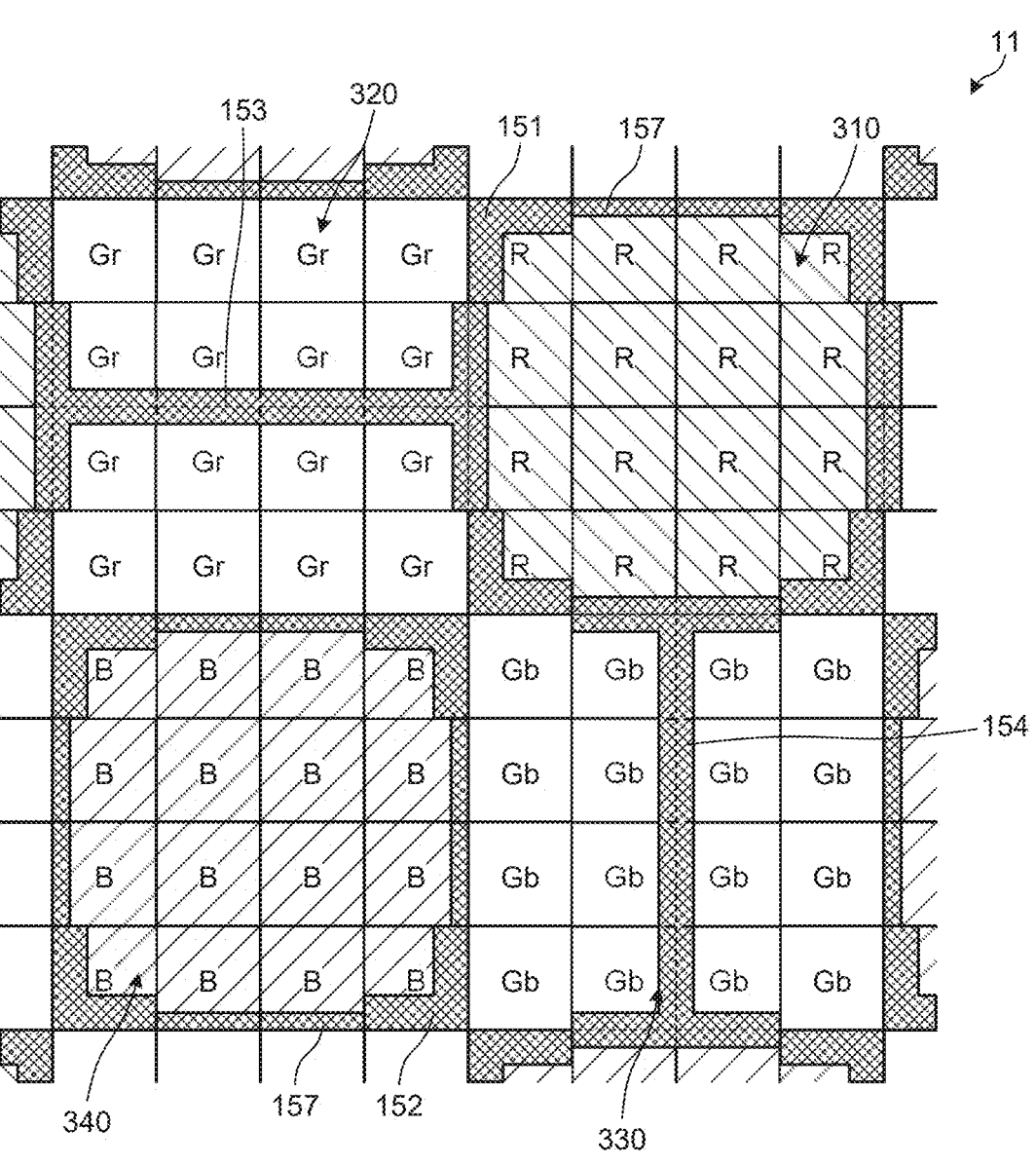
FIG. 21 is a diagram illustrating another configuration example of pixels according to the fourth embodiment of the present disclosure.

FIG. 21 is a diagram illustrating another configuration example of pixels according to the fourth embodiment of the present disclosure. The drawing illustrates an example in which the width of the light-shielding wall is adjusted for each pixel 100 of the pixel group. The light-shielding wall 151 is disposed in the red pixel 100a at a corner of the red pixel group 310 in the drawing, and a light-shielding wall 157 is disposed in the red pixel 100a at a side. As a result, the sensitivity of the red pixels 100a disposed at the corner and the side of the red pixel group 310 can be individually adjusted. The light-shielding wall 157 can have the same width as the light-shielding wall 150, for example.

The light-shielding wall 152 is disposed in the blue pixel 100d at a corner of the blue pixel group 340 in the drawing, and the light-shielding wall 157 is disposed in the blue pixel 100d at a side. As a result, the sensitivity of the blue pixels 100d disposed at the corners and the sides of the blue pixel group 340 can be individually adjusted.

The configuration of the imaging element 10 other than the above configuration is similar to the configuration of the imaging element 10 according to the first embodiment of the present disclosure, and thus will not be described.

As described above, the imaging element 10 according to the fourth embodiment of the present disclosure adjusts the shape and the like of the light-shielding wall 151 and the like for each pixel block. This makes it possible to reduce variations in sensitivity of the pixels 100 in the pixel group.

5. Fifth Embodiment

The imaging element 10 according to the first embodiment described above adjusts the shape and the like of the on-chip lens. On the other hand, an imaging element 10 according to a fifth embodiment of the present disclosure is different from the first embodiment in that the light-shielding wall is further adjusted.

[Configuration of Pixels]

Figure 22:
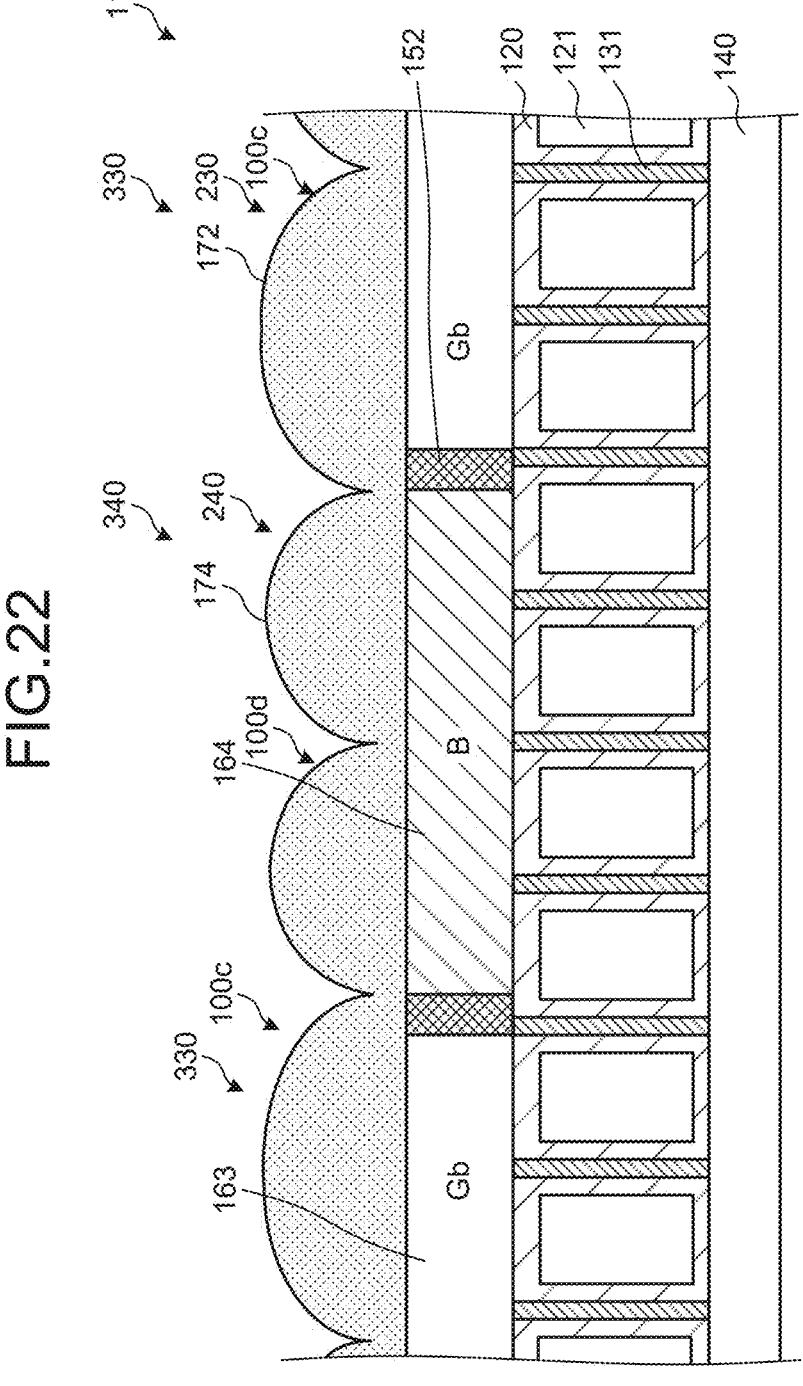
FIG. 22 is a diagram illustrating a configuration example of pixels according to a fifth embodiment of the present disclosure.

FIG. 22 is a diagram illustrating a configuration example of pixels according to the fifth embodiment of the present disclosure. The drawing is a sectional view illustrating a configuration example of the pixels 100, similarly to FIG. 6. The drawing illustrates the green pixels 100c of the green pixel block 230 of the green pixel group 330 and the blue pixels 100d of the blue pixel block 240 of the blue pixel group 340. The on-chip lens 172 in the drawing can also have a shape protruding to the region of the blue pixel group 340. In the green pixel group 320 in the drawing, the light-shielding wall 152 having a shape projecting in the region of the blue pixel group 340 can be disposed.

The configuration of the imaging element 10 other than the above configuration is similar to the configuration of the imaging element 10 according to the first embodiment of the present disclosure, and thus will not be described.

As described above, the imaging element 10 according to the fifth embodiment of the present disclosure can reduce variations in sensitivity of the pixels 100 in the pixel group by adjusting the on-chip lens and the light-shielding wall.

Although the embodiments of the present disclosure have been described above, the technical scope of the present disclosure is not limited to the above embodiments as it is, and various modifications can be made without departing from the gist of the present disclosure. The constituent elements of different embodiments and modifications may be appropriately combined.

Note that the effects described in this specification are merely examples and are not limited, and other effects may be provided.

Note that the present technique can also have the following configurations.

(1)

An imaging element comprising:

a pixel array unit configured by arranging, in a Bayer array, a red pixel group in which red pixel blocks are arranged in two rows and two columns, a green pixel group in which green pixel blocks are arranged in two rows and two columns, and a blue pixel group in which blue pixel blocks are arranged in two rows and two columns, the red pixel blocks being configured by arranging, in two rows and two columns, red pixels that include a color filter transmitting red light, perform photoelectric conversion of incident light transmitted through the color filter, and generate an image signal corresponding to the red light and by arranging a common on-chip lens, the green pixel blocks being configured by arranging, in two rows and two columns, green pixels that include a color filter transmitting green light, perform photoelectric conversion of incident light transmitted through the color filter, and generate an image signal corresponding to the green light and by arranging a common on-chip lens, the blue pixel blocks being configured by arranging, in two rows and two columns, blue pixels that include a color filter transmitting blue light, perform photoelectric conversion of incident light transmitted through the color filter, and generate an image signal corresponding to the blue light and by arranging a common on-chip lens, wherein the common on-chip lens has a different shape for each of the red pixel group, the green pixel group, and the blue pixel group.

(2)

The imaging element according to the above (1), wherein the common on-chip lens has a different size in plan view for each of the red pixel group, the green pixel group, and the blue pixel group.

(3)

The imaging element according to the above (1) or (2), wherein the common on-chip lens of the red pixel group has a shape protruding to a region of the green pixel group.

(4)

The imaging element according to any one of the above (1) to (3), wherein the common on-chip lens of the green pixel group has a shape protruding to a region of the blue pixel group.

(5)

The imaging element according to any one of the above (1) to (4), wherein the common on-chip lens has a different height in plan view for each of the red pixel group, the green pixel group, and the blue pixel group.

(6)

The imaging element according to any one of the above (1) to (5), wherein a recess is provided at a center of the common on-chip lens.

(7)

The imaging element according to any one of the above (1) to (6), wherein the common on-chip lens has a substantially rectangular shape.

(8)

The imaging element according to the above (7), wherein the common on-chip lens has a shape in contact with another adjacent on-chip lens.

(9)

An imaging device comprising:

a pixel array unit configured by arranging, in a Bayer array, a red pixel group in which red pixel blocks are arranged in two rows and two columns, a green pixel group in which green pixel blocks are arranged in two rows and two columns, and a blue pixel group in which blue pixel blocks are arranged in two rows and two columns, the red pixel blocks being configured by arranging, in two rows and two columns, red pixels that include a color filter transmitting red light, perform photoelectric conversion of incident light transmitted through the color filter, and generate an image signal corresponding to the red light and by arranging a common on-chip lens, the green pixel blocks being configured by arranging, in two rows and two columns, green pixels that include a color filter transmitting green light, perform photoelectric conversion of incident light transmitted through the color filter, and generate an image signal corresponding to the green light and by arranging a common on-chip lens, the blue pixel blocks being configured by arranging, in two rows and two columns, blue pixels that include a color filter transmitting blue light, perform photoelectric conversion of incident light transmitted through the color filter, and generate an image signal corresponding to the blue light and by arranging a common on-chip lens; and a processing circuit that processes the image signal, wherein the common on-chip lens has a different shape for each of the red pixel group, the green pixel group, and the blue pixel group.

(10)

An imaging element comprising:

a pixel array unit configured by arranging, in a Bayer array, a red pixel group in which red pixel blocks are arranged in two rows and two columns, a green pixel group in which green pixel blocks are arranged in two rows and two columns, and a blue pixel group in which blue pixel blocks are arranged in two rows and two columns, the red pixel blocks being configured by arranging, in two rows and two columns, red pixels that include a color filter transmitting red light, perform photoelectric conversion of incident light transmitted through the color filter, and generate an image signal corresponding to the red light and by arranging a common on-chip lens, the green pixel blocks being configured by arranging, in two rows and two columns, green pixels that include a color filter transmitting green light, perform photoelectric conversion of incident light transmitted through the color filter, and generate an image signal corresponding to the green light and by arranging a common on-chip lens, the blue pixel blocks being configured by arranging, in two rows and two columns, blue pixels that include a color filter transmitting blue light, perform photoelectric conversion of incident light transmitted through the color filter, and generate an image signal corresponding to the blue light and by arranging a common on-chip lens; and a light-shielding wall disposed in a region of the color filter between the red pixel group, the green pixel group, and the blue pixel group, wherein the light-shielding wall has a different shape for each of the red pixel group, the green pixel group, and the blue pixel group.

(11)

The imaging element according to the above (10), wherein the light-shielding wall disposed between the red pixel group and the green pixel group has a shape protruding in a region of the red pixel group.

(12)

The imaging element according to the above (11), wherein among the light-shielding walls disposed between the red pixel group and the green pixel group, the light-shielding wall adjacent to the green pixel at a corner of the red pixel group has a shape protruding to the region of the red pixel group.

(13)

The imaging element according to the above (10), wherein the light-shielding wall disposed between the blue pixel group and the green pixel group has a shape protruding in a region of the blue pixel group.

(14)

The imaging element according to the above (13), wherein among the light-shielding walls disposed between the blue pixel group and the green pixel group, the light-shielding wall adjacent to the green pixel at a corner of the blue pixel group has a shape protruding to the region of the blue pixel group.

(15)

The imaging element according to (10), wherein the light-shielding wall having a width different from a width of the red pixel disposed at a side is disposed in the red pixel disposed at a corner in the red pixel disposed in an outer periphery of the red pixel group, and the light-shielding wall having a width different from a width of the blue pixel disposed at a side is disposed in the blue pixel disposed at a corner in the blue pixel disposed in an outer periphery of the blue pixel group.

(16)

The imaging element according to any one of the above (10) to (15), wherein the light-shielding wall in a direction perpendicular to a direction adjacent to the blue pixel group is further disposed at a center of the green pixel group.

(17)

The imaging element according to any one of the above (10) to (16), further comprising a second light-shielding wall disposed around each of the red pixels, the green pixels, and the blue pixels and having a narrower width than the light-shielding wall.

(18)

The imaging element according to any one of the above (10) to (17), wherein the light-shielding wall includes an oxide film.

(19)

The imaging element according to any one of the above (10) to (17), wherein the light-shielding wall includes a low refractive index member.

(20)

The imaging element according to the above (19), wherein the light-shielding wall includes a gap.

(21)

An imaging device comprising:

a pixel array unit configured by arranging, in a Bayer array, a red pixel group in which red pixel blocks are arranged in two rows and two columns, a green pixel group in which green pixel blocks are arranged in two rows and two columns, and a blue pixel group in which blue pixel blocks are arranged in two rows and two columns, the red pixel blocks being configured by arranging, in two rows and two columns, red pixels that include a color filter transmitting red light, perform photoelectric conversion of incident light transmitted through the color filter, and generate an image signal corresponding to the red light and by arranging a common on-chip lens, the green pixel blocks being configured by arranging, in two rows and two columns, green pixels that include a color filter transmitting green light, perform photoelectric conversion of incident light transmitted through the color filter, and generate an image signal corresponding to the green light and by arranging a common on-chip lens, the blue pixel blocks being configured by arranging, in two rows and two columns, blue pixels that include a color filter transmitting blue light, perform photoelectric conversion of incident light transmitted through the color filter, and generate an image signal corresponding to the blue light and by arranging a common on-chip lens;

a light-shielding wall disposed in a region of the color filter between the red pixel group, the green pixel group, and the blue pixel group; and a processing circuit that processes the image signal, wherein the light-shielding wall has a different shape for each of the red pixel group, the green pixel group, and the blue pixel group.

REFERENCE SIGNS LIST

10 IMAGING ELEMENT
11 PIXEL ARRAY UNIT
13 COLUMN SIGNAL PROCESSOR
100 PIXEL
100a RED PIXEL
100b, 100c GREEN PIXEL
100d BLUE PIXEL
150 to 157 LIGHT-SHIELDING WALL
161 to 164 COLOR FILTER
171 to 174 ON-CHIP LENS
176, 178 RECESS
210 RED PIXEL BLOCK
220, 230 GREEN PIXEL BLOCK
240 BLUE PIXEL BLOCK
310 RED PIXEL GROUP
320, 330 GREEN PIXEL GROUP
340 BLUE PIXEL GROUP

What is claimed is:

1. An imaging element, comprising:

a pixel array unit configured by arranging, in a Bayer array, a red pixel group in which red pixel blocks are arranged in two rows and two columns, a green pixel group in which green pixel blocks are arranged in two rows and two columns, and a blue pixel group in which blue pixel blocks are arranged in two rows and two columns, the red pixel blocks being configured by arranging, in two rows and two columns, red pixels that include a color filter transmitting red light, perform photoelectric conversion of incident light transmitted through the color filter, and generate an image signal corresponding to the red light and by arranging a common on-chip lens, the green pixel blocks being configured by arranging, in two rows and two columns, green pixels that include a color filter transmitting green light, perform photoelectric conversion of incident light transmitted through the color filter, and generate an image signal corresponding to the green light and by arranging a common on-chip lens, the blue pixel blocks being configured by arranging, in two rows and two columns, blue pixels that include a color filter transmitting blue light, perform photoelectric conversion of incident light transmitted through the color filter, and generate an image signal corresponding to the blue light and by arranging a common on-chip lens, wherein the common on-chip lens has a different shape for each of the red pixel group, the green pixel group, and the blue pixel group.

2. The imaging element according to claim 1, wherein the common on-chip lens has a different size in plan view for each of the red pixel group, the green pixel group, and the blue pixel group.

3. The imaging element according to claim 1, wherein the common on-chip lens of the red pixel group has a shape protruding to a region of the green pixel group.

4. The imaging element according to claim 1, wherein the common on-chip lens of the green pixel group has a shape protruding to a region of the blue pixel group.

5. The imaging element according to claim 1, wherein the common on-chip lens has a different height in plan view for each of the red pixel group, the green pixel group, and the blue pixel group.

6. The imaging element according to claim 1, wherein a recess is provided at a center of the common on-chip lens.

7. The imaging element according to claim 1, wherein the common on-chip lens has a substantially rectangular shape.

8. The imaging element according to claim 7, wherein the common on-chip lens has a shape in contact with another adjacent on-chip lens.

9. An imaging device, comprising:

a pixel array unit configured by arranging, in a Bayer array, a red pixel group in which red pixel blocks are arranged in two rows and two columns, a green pixel group in which green pixel blocks are arranged in two rows and two columns, and a blue pixel group in which blue pixel blocks are arranged in two rows and two columns, the red pixel blocks being configured by arranging, in two rows and two columns, red pixels that include a color filter transmitting red light, perform photoelectric conversion of incident light transmitted through the color filter, and generate an image signal corresponding to the red light and by arranging a common on-chip lens, the green pixel blocks being configured by arranging, in two rows and two columns, green pixels that include a color filter transmitting green light, perform photoelectric conversion of incident light transmitted through the color filter, and generate an image signal corresponding to the green light and by arranging a common on-chip lens, the blue pixel blocks being configured by arranging, in two rows and two columns, blue pixels that include a color filter transmitting blue light, perform photoelectric conversion of incident light transmitted through the color filter, and generate an image signal corresponding to the blue light and by arranging a common on-chip lens; and a processing circuit that processes the image signal, wherein the common on-chip lens has a different shape for each of the red pixel group, the green pixel group, and the blue pixel group.

10. An imaging element, comprising:

a pixel array unit configured by arranging, in a Bayer array, a red pixel group in which red pixel blocks are arranged in two rows and two columns, a green pixel group in which green pixel blocks are arranged in two rows and two columns, and a blue pixel group in which blue pixel blocks are arranged in two rows and two columns, the red pixel blocks being configured by arranging, in two rows and two columns, red pixels that include a color filter transmitting red light, perform photoelectric conversion of incident light transmitted through the color filter, and generate an image signal corresponding to the red light and by arranging a common on-chip lens, the green pixel blocks being configured by arranging, in two rows and two columns, green pixels that include a color filter transmitting green light, perform photoelectric conversion of incident light transmitted through the color filter, and generate an image signal corresponding to the green light and by arranging a common on-chip lens, the blue pixel blocks being configured by arranging, in two rows and two columns, blue pixels that include a color filter transmitting blue light, perform photoelectric conversion of incident light transmitted through the color filter, and generate an image signal corresponding to the blue light and by arranging a common on-chip lens; and a light-shielding wall disposed in a region of the color filter between the red pixel group, the green pixel group, and the blue pixel group, wherein the light-shielding wall has a different shape for each of the red pixel group, the green pixel group, and the blue pixel group.

11. The imaging element according to claim 10, wherein the light-shielding wall disposed between the red pixel group and the green pixel group has a shape protruding in a region of the red pixel group.

12. The imaging element according to claim 11, wherein among the light-shielding walls disposed between the red pixel group and the green pixel group, the light-shielding wall adjacent to the green pixel at a corner of the red pixel group has a shape protruding to the region of the red pixel group.

13. The imaging element according to claim 10, wherein the light-shielding wall disposed between the blue pixel group and the green pixel group has a shape protruding in a region of the blue pixel group.

14. The imaging element according to claim 13, wherein among the light-shielding walls disposed between the blue pixel group and the green pixel group, the light-shielding wall adjacent to the green pixel at a corner of the blue pixel group has a shape protruding to the region of the blue pixel group.

15. The imaging element according to claim 10, wherein the light-shielding wall having a width different from a width of the red pixel disposed at a side is disposed in the red pixel disposed at a corner in the red pixel disposed in an outer periphery of the red pixel group, and the light-shielding wall having a width different from a width of the blue pixel disposed at a side is disposed in the blue pixel disposed at a corner in the blue pixel disposed in an outer periphery of the blue pixel group.

16. The imaging element according to claim 10, wherein the light-shielding wall in a direction perpendicular to a direction adjacent to the blue pixel group is further disposed at a center of the green pixel group.

17. The imaging element according to claim 10, further comprising a second light-shielding wall disposed around each of the red pixels, the green pixels, and the blue pixels and having a narrower width than the light-shielding wall.

18. The imaging element according to claim 10, wherein the light-shielding wall includes an oxide film.

19. The imaging element according to claim 10, wherein the light-shielding wall includes a low refractive index member.

20. The imaging element according to claim 19, wherein the light-shielding wall includes a gap.

21. An imaging device, comprising:

a pixel array unit configured by arranging, in a Bayer array, a red pixel group in which red pixel blocks are arranged in two rows and two columns, a green pixel group in which green pixel blocks are arranged in two rows and two columns, and a blue pixel group in which blue pixel blocks are arranged in two rows and two columns, the red pixel blocks being configured by arranging, in two rows and two columns, red pixels that include a color filter transmitting red light, perform photoelectric conversion of incident light transmitted through the color filter, and generate an image signal corresponding to the red light and by arranging a common on-chip lens, the green pixel blocks being configured by arranging, in two rows and two columns, green pixels that include a color filter transmitting green light, perform photoelectric conversion of incident light transmitted through the color filter, and generate an image signal corresponding to the green light and by arranging a common on-chip lens, the blue pixel blocks being configured by arranging, in two rows and two columns, blue pixels that include a color filter transmitting blue light, perform photoelectric conversion of incident light transmitted through the color filter, and generate an image signal corresponding to the blue light and by arranging a common on-chip lens;

a light-shielding wall disposed in a region of the color filter between the red pixel group, the green pixel group, and the blue pixel group; and a processing circuit that processes the image signal, wherein the light-shielding wall has a different shape for each of the red pixel group, the green pixel group, and the blue pixel group.

\* \* \* \* \*